United States Patent [19]

O'Shaughnessy et al.

[11] Patent Number: 5,521,556

[45] Date of Patent: May 28, 1996

[54] FREQUENCY CONVERTER UTILIZING A FEEDBACK CONTROL LOOP

[75] Inventors: Timothy G. O'Shaughnessy, McCammon; Timothy Derosier, Chubbuck; Charles A. Edmondson, Pocatello; Morgan K. Ercanbrack, Robin, all of Id.

[73] Assignee: American Microsystems, Inc., Pocatello, Id.

[21] Appl. No.: 379,049

[22] Filed: Jan. 27, 1995

[51] Int. Cl.$^6$ .............................. H03B 5/00; H03K 3/354; H03L 7/097

[52] U.S. Cl. .............................. 331/1 R; 331/8; 331/14; 331/17; 331/25; 331/34; 331/57; 331/111

[58] Field of Search .............................. 331/1 R, 8, 14, 331/17, 25, 34, 57, 111

[56] References Cited

U.S. PATENT DOCUMENTS

| | | | |
|---|---|---|---|
| 3,893,040 | 7/1975 | Harp | 331/14 |
| 4,617,529 | 10/1986 | Suzuki | 331/57 |
| 4,906,944 | 3/1990 | Frerking | 331/17 |
| 4,994,763 | 2/1991 | Chen et al. | 331/57 |
| 4,998,075 | 3/1991 | Patton, III et al. | 331/2 |
| 5,017,919 | 5/1991 | Hull et al. | 341/136 |

*Primary Examiner*—Siegfried H. Grimm
*Attorney, Agent, or Firm*—Skjerven, Morrill, MacPherson, Franklin & Friel; Ken J. Koestner

[57] ABSTRACT

A monolithic frequency converter using a feedback control loop generates a source of synthesized frequency signals over a wide dynamic range based on a timing source such as a crystal oscillator or an external frequency source. The frequency converter includes a controlled oscillator, a frequency counter, a timing signal generator and, connected between the frequency counter and the controlled oscillator, a digital to analog converter and a difference integrator. The controlled oscillator generates a clock signal at a frequency controlled by an electrical signal. The difference integrator is connected to an input signal terminal and connected to the timing signal generator. The difference integrator determines a difference signal between the input signal and a signal operated upon by the digital to analog converter and integrates the difference signal under control of a timing signal generated by the timing signal generator. The frequency converter has a highly linear transfer function which is established by the resolution of a frequency counter. For example, a transfer function having approximately 0.1% accuracy in linearity is achieved using a 10-bit resolution frequency counter. Using indirect frequency synthesis, the controlled oscillator generates precisely controlled timing signals.

27 Claims, 12 Drawing Sheets

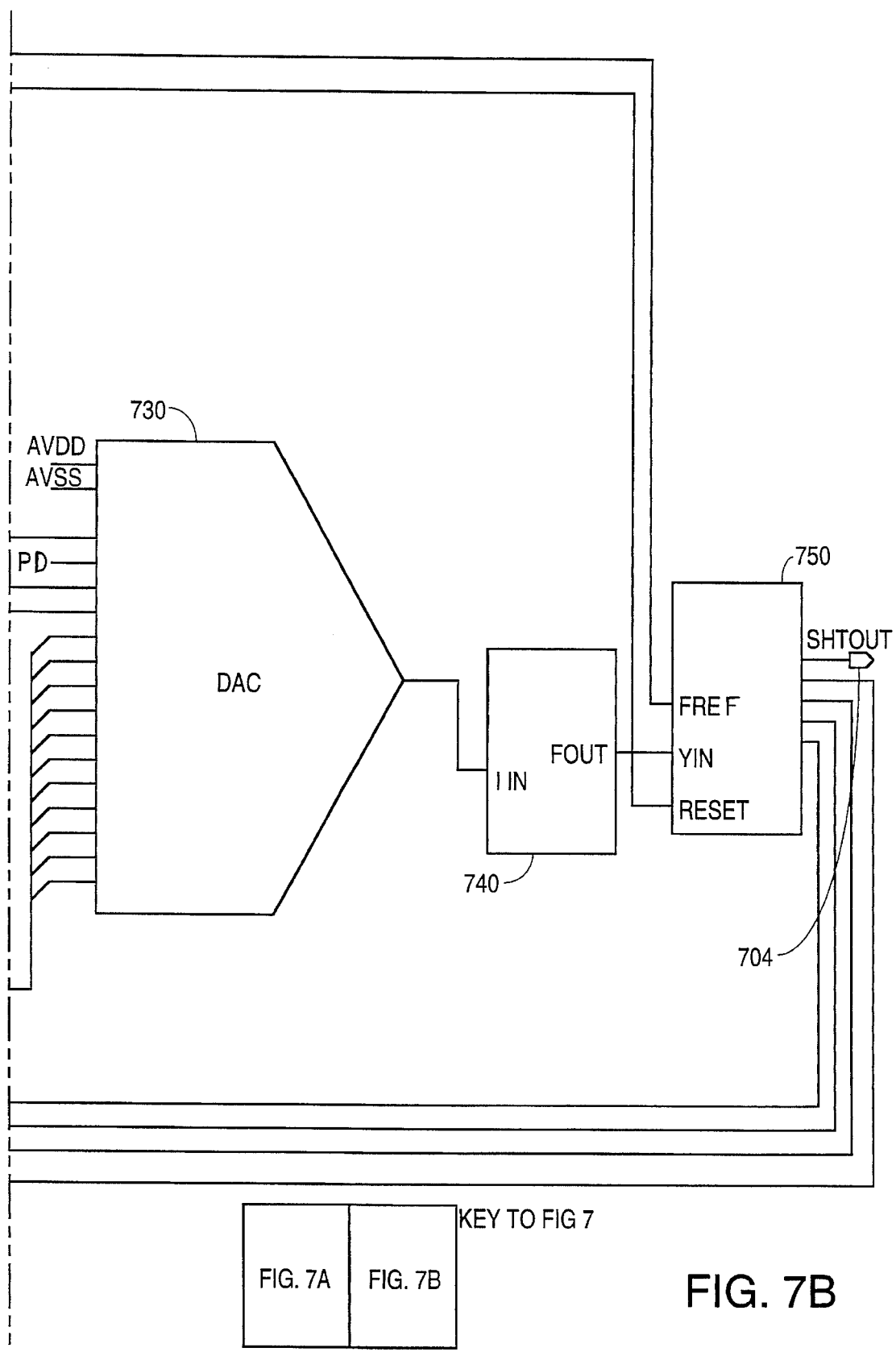

5,521,556

FREQUENCY CONVERTER UTILIZING A FEEDBACK CONTROL LOOP

FIELD OF INVENTION

This invention relates to the field of frequency converter circuits. More specifically, this invention describes a frequency converter circuit for generating a timing signal at a frequency controlled by an input signal having an arbitrary form utilizing an indirect frequency synthesis method.

BACKGROUND OF THE INVENTION

Electronic circuits often require timing pulses of a selected, stable frequency to control various functions. Phase-locked loops are sometimes utilized to provide such timing pulses. However, some disadvantages are associated with phase-locked loops. For example, phase-locked loops typically utilize a voltage-controlled oscillator (VCO) in the feedback path. Various limitations are associated with analog voltage-controlled oscillators. Nonlinear effects in MOS transistors of the VCO result in a highly nonlinear transformation of voltage to frequency by the VCO. Another disadvantage of utilizing a VCO is a substantial relative intrinsic delay in the response of the VCO.

In addition, in a conventional phase-locked loop system, a loop filter is typically used to obtain frequency stability in the feedback loop. The loop filter typically includes two capacitors and a resistor which are external to the integrated circuit. An integrated circuit normally produces some internal digital switching noise which induce noise signals on VDD and VSS power supply lines. Because the ground reference potential internal to the integrated circuit includes some noise, the ground potential internal to the integrated circuit has a different potential than the ground reference external to the integrated circuit. This voltage difference between the ground potential internal to the integrated circuit and the ground potential of the loop filter components outside the integrated circuit unavoidably introduces some noise, called phase jitter, on the output of the phase-locked loop.

In many applications, performance degradation arising from phase jitter and nonlinear behavior of the voltage-controlled oscillator is too great to overcome using a phase-locked loop circuit. Therefore a new approach is sought.

SUMMARY OF THE INVENTION

In accordance with one embodiment of the present invention, a frequency converter is furnished which includes a controlled oscillator for generating a clock signal at a frequency controlled by an electrical signal or by an electrical signal responding to another electrical parameter. The frequency converter also includes a frequency counter connected to the controlled oscillator and including a timing signal generator. The frequency converter further includes a digital to analog converter connected between the frequency converter and the controlled oscillator. The digital to analog converter converts a digital code to an analog electrical signal. The frequency converter further includes a difference integrator connected between the frequency counter and the controlled oscillator, connected to an input signal terminal and connected to the timing signal generator. The difference integrator determines a difference signal between an input signal and a signal operated upon by the digital to analog converter and integrates the difference signal under control of a timing signal generated by the timing signal generator.

In accordance with an additional embodiment of the present invention, the frequency converter is configured as a voltage-tuned or voltage-controlled oscillator and the controlled oscillator is a voltage-controlled oscillator (VCO) having an input terminal connected to a difference integrator and an output terminal connected to a frequency counter. The frequency counter has an input terminal connected to the output terminal of the voltage-controlled oscillator, a plurality of output lines connected to the digital to analog converter for communicating a digital frequency signal and an output control line connected to the difference integrator. The digital to analog converter has a plurality of input lines connected to the output lines of the frequency counter and an analog output line connected to the difference integrator. The difference integrator has an input terminal connected to the analog output line of the digital to analog converter and an input control line connected to the output control line of the frequency counter.

In another embodiment, the frequency converter is configured as a digitally-tuned oscillator and the controlled oscillator is a current-controlled oscillator (CCO) having an input terminal connected to the digital to analog converter and an output terminal connected to the frequency counter. The frequency counter has an input terminal connected to the output terminal of the current-controlled oscillator, a plurality of output lines connected to the difference integrator for communicating a digital frequency signal and an output control line connected to the difference integrator. The difference integrator has a plurality of input lines connected to the output lines of the frequency counter, a plurality of signal input lines at the input signal terminal for receiving a digital input signal and a plurality of output lines connected to the digital to analog converter for communicating a digital difference integral signal. The digital to analog converter has a plurality of input lines connected to the output lines of the difference integrator and an analog output line connected to the current-controlled oscillator.

In some embodiments, the current-controlled oscillator (CCO) includes a difference amplifier, an oscillator capacitor connected to the difference amplifier and a ring oscillator connected to the difference amplifier by a feedforward path and a feedback path. The CCO also includes a feedback capacitor connected between the difference amplifier and the ring oscillator in the feedback path.

Use of the frequency converter as described above has several advantages. One advantage is that the frequency converter controls the output frequency with a highly linear transfer function. An additional advantage is that the frequency converter avoids performance degradation caused by phase jitter by eliminating the external loop filter which is employed in a typical conventional phase-locked loop circuit. Another advantage is that the timing of integration by the difference integrator is controlled by the frequency counter. Because the difference integrator only compares the voltages periodically under the control of the VCO counter, feedback stability performance and electrical performance are improved.

A further advantage is that the described frequency converter accommodates various alternative input signals. The input signals supplied to a frequency converter may take many forms. For example, voltage, current, resistance, capacitance and impedance electrical signals may be supplied to a circuit for converting the supplied electrical signal to a frequency signal. Furthermore, a digital code may be applied as an input signal. The described frequency converter is configurable to accept various arbitrary input signals. In some embodiments, a multiplexer may be supplied at the input terminal so that one of multiple types of input signals is selected by a circuit.

DETAILED DESCRIPTION

A frequency converter using a feedback control loop generates a source of synthesized frequency signals over a wide dynamic range (e.g. 1 kHz to 1 MHz, or 2.5 MHz to 35 Mhz, for example) based on a timing source such as a crystal oscillator or an external frequency source. The frequency converter has a highly linear transfer function which is established by the resolution of a frequency counter. A transfer function having approximately 0.1% accuracy in linearity is achieved using a 10-bit resolution frequency counter. The transfer function is sufficiently linear that the frequency converter may be used as an analog to digital converter (ADC). In other applications, the frequency converter is useful in telemetry devices in which a measurement is transmitted from a remote location. Using indirect frequency synthesis, the controlled oscillator generates precisely controlled timing signals. The frequency converter is a monolithic frequency converter using a feedback control loop. In a monolithic circuit, all components are formed on a single integrated circuit chip. In addition, the frequency converter provides for utilization of a precision RC oscillator as a timing source on the same monolithic integrated circuit chip.

Figure 1:
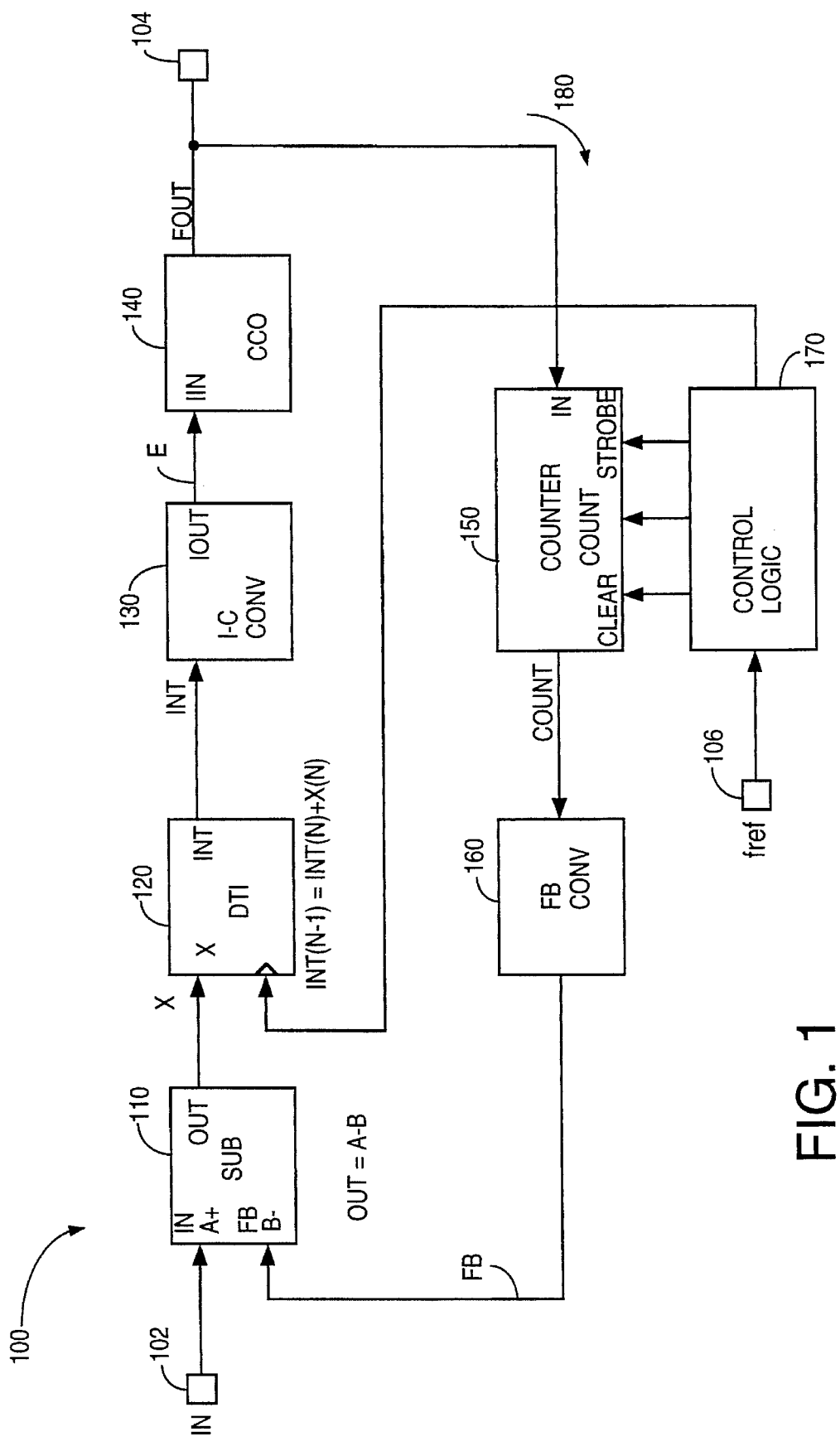
FIG. 1 illustrates a schematic block diagram of a frequency converter in accordance with a generic embodiment of the present invention.

Referring to FIG. 1, a schematic block diagram of a generic frequency converter 100 is shown. The frequency converter 100 generates a source of synthesized frequency from a timing source. The generic frequency converter 100 includes a subtractor 110, a discrete time integrator 120, a data converter 130, a controlled-oscillator 140, a frequency counter 150, a feedback converter 160 and a control logic block 170. In specific embodiments, various blocks of the generic frequency converter 100 may be omitted or combined with other blocks. For example, the converter blocks (data converter 130 and feedback converter 160) are utilized only when signal conversion is necessary to make data compatible from one block to the next. A minimum generic frequency converter 100 embodiment utilizes a difference-integrator circuit (shown as the combination of subtractor 110 and discrete time integrator 120), a frequency counter 150 and a controlled oscillator 140. The difference-integrator circuit is a combination of the subtractor 110 and a discrete-time integrator 120 circuit. The control logic block 170 either receives a timing signal from a source which is internal to the monolithic integrated circuit or from a timing source external to the monolithic integrated circuit.

The frequency converter 100 includes a sampled-dam feedback loop 180 in which the controlled oscillator 140 generates timing pulses at a controlled frequency, making these timing pulses Fout available at an output terminal 104. The frequency converter 100 operates using the frequency counter 150 to count the number of pulses at the controlled oscillator 140 output terminal during a fixed interval. The feedback converter 160, if utilized, converts the count information into a feedback signal in a form that can be compared to an input signal IN at an input terminal 102. The difference-integrator circuit compares the feedback signal to the input signal IN and generates an error signal E which drives the controlled oscillator 140.

In an analog embodiment, the subtractor 110 includes a differential amplifier (not shown) for detecting and amplifying small differences between two voltages. The subtractor 110 has an inverted input terminal, a noninverted input terminal and an output terminal. An input stimulus such as a voltage, current, resistance, capacitance, or a digital code is applied at a input terminal 102 and connected to the noninverting input terminal of the subtractor 110. The subtractor 110 receives a feedback signal (FB) at the inverted input terminal and subtracts the feedback signal from the input stimulus (IN) and generates an output signal (X), such as a voltage signal, which corresponds to the difference of the input stimulus and feedback signals and is nearly equal to the value, X=IN–FB. For example, if the frequency of the current controlled oscillator (CCO) 140 is zero, then the output of the feedback converter FBCONV 160 is zero. The corresponding output signal of the subtractor 110 is X=IN–FB=IN–0 =IN. The signal generated by the subtractor 110 is applied to the discrete time integrator DTI 120. In some embodiments of the frequency converter 100, the subtractor 110 and integrator 120 blocks are combined into a difference-integrator circuit (not shown).

A digital embodiment of the subtractor 110, multiple-bit digital input IN and feedback FB signals are applied to a multiple-bit binary adder circuit(not shown) or arithmetic logic unit (not shown). In such an embodiment, the feedback FB signal is converted to a twos complement form prior to the addition operation.

Subtractor 110 performs a function which is similar to that of a phase comparator in a phase-locked loop (PLL). The phase comparator of the phase-locked loop produces an output signal which is proportional to the phase difference between the input of the PLL and the output of the voltage-controlled oscillator (VCO). The subtractor 110 of the frequency converter 100 produces an output signal which is essentially equal to the difference between the input signal on input terminal 102 and the output signal of the feedback converter FBCONV 160. The subtractor 110 produces a signal which is proportional to the phase difference between the incoming signal IN and the controlled oscillator 140 output signal. The output of the subtractor 110 is applied to the input of the discrete time integrator 120 which produces an output signal applied to the control input terminal IIN of the controlled oscillator 140. If, for example, the frequency of the controlled oscillator 140 shifts slightly, the feedback converter FBCONV 160 produces a corresponding change to the feedback signal. This produces a corresponding change in the difference of IIN–FB, the output signal of subtractor 110. Thus the feedback loop 180 maintains lock when the input signal frequency changes and the controlled oscillator 140 input current is proportional to the frequency of the incoming signal. Likewise, if a change occurs at the input terminal 102, a corresponding change occurs at the output terminal of the subtractor 110. This produces a corresponding change at the input terminal to the controlled oscillator 140. Accordingly, any change at the input terminal 102 produces a proportional change in the output signal of the frequency converter 100. When the loop is locked, the output signal of the controlled oscillator 140 and the incoming signal IN is a linear relationship.

Discrete time integrator DTI 120 computes a recursive integration of the difference signal from the subtractor 110, generating an integrated signal INT as follows:

$$INT_{N+1}=INT_N+X_N.$$

The integrated signal $INT_{N+1}$ generated by the DTI 120 has the form:

$$INT_{N+1}=INT_N+A_N-BN,$$

and $$INT_{N+1}=INT_N+IN_N-FBCONV_N,$$

where $FBCONV_N$ is the output signal of the feedback converter 160 which corresponds to the frequency of the controlled oscillator.

The integrated signal $INT_{N+1}$ generated by the DTI 120 is applied to the input terminal of the integrator-to-current-converter ICCONV 130. The discrete time integrator 120 filters difference components resulting from interfering signals far from the center frequency of the controlled oscillator 140.

The integrator to current converter (ICCONV) 130 converts the output signal of the discrete time integrator 120 into a form which is convenient for the controlled oscillator 140. For example, to exploit various advantages achieved by the current-controlled oscillator 140 as compared to a voltage-controlled oscillator 140, ICCONV converts the signal from the DTI, for example a voltage signal, to a current signal for application to current-controlled oscillator 140 (CCO). In many circuit embodiments, a CCO may replace a typical VCO circuit through the usage of a voltage to current generator circuit.

The controlled oscillator 140 generates timing pulses at a frequency which is controlled by the input signal IN in conjunction with the feedback signal FB. In various embodiments of the frequency converter 100, the controlled oscillator may be formed as a current-controlled oscillator (CCO) or a voltage-controlled oscillator (VCO). A current-controlled oscillator (CCO) is an oscillator which generates a signal frequency proportional to an externally applied current. Thus the frequency of the CCO varies as a function of the current applied to the CCO input terminal.

In a current-controlled oscillator (CCO) implementation, the current signal which is generated by the ICCONV 130 increases as the DTI 120 signal increases, thereby enlarging the current applied to the controlled oscillator 140 and raising the frequency of the CCO 140. When the loop is in lock, the CCO frequency is exactly proportional to the corresponding value applied to the input terminal 102. A voltage-controlled oscillator (VCO) is an oscillator typically used in circuits such as phase-locked loops. For high frequency operation on the order of tens of MHz or higher (hundreds of MHz), the CCO is superior to a conventional voltage controlled-oscillator (VCO) implementation.

The frequency counter 150 counts the frequency of the signal produced by the CCO and applies the count to the feedback converter FBCONV 160. The input stimulus IN to the subtractor 110 controls the output frequency with a substantially linear transfer function. Transfer function linearity is established by the resolution of the frequency counter 150.

Feedback converter FBCONV 160 converts the count signal from the frequency counter 150 to a form which is subtracted from the input signal to the subtractor 110. As the frequency of the controlled oscillator 140 increases, the output signal of the frequency counter 150 and FBCONV 160 increases, decreasing the value of the output signal of the subtractor 110. In response, the output signal of the discrete time integrator DTI 120 asymptotically approaches a value that establishes the frequency of the controlled oscillator 140.

Control logic 170 applies signals to the frequency counter 150 and to the discrete time integrator 120 to control the frequency converter 100. Timing of the control logic 170 is driven by a timing source (not shown). In various embodiments of the frequency converter 100, the timing source is furnished as an external frequency source such as a crystal oscillator or external RC circuit. In other embodiments, the timing source is constructed into the monolithic integrated circuit in the form of an RC oscillator which is trimmed to furnish a selected frequency, or by a crystal oscillator having the crystal element connected to the pins of the integrated circuit.

Thus the frequency converter 100 establishes a steady state frequency as a function of the value applied at the input terminal (IN) to the subtractor 110, the timing interval of the frequency counter 150 and the transfer function of the feedback converter FBCONV 160.

The frequency converter 100 achieves improvement over a conventional phase-locked loop converter system because the frequency converter 100 advantageously does not require a loop filter. The frequency converter 100 of this embodiment produces an output frequency which is proportional to the appropriate steady-state value applied to the input terminal 102.

Figure 2A:
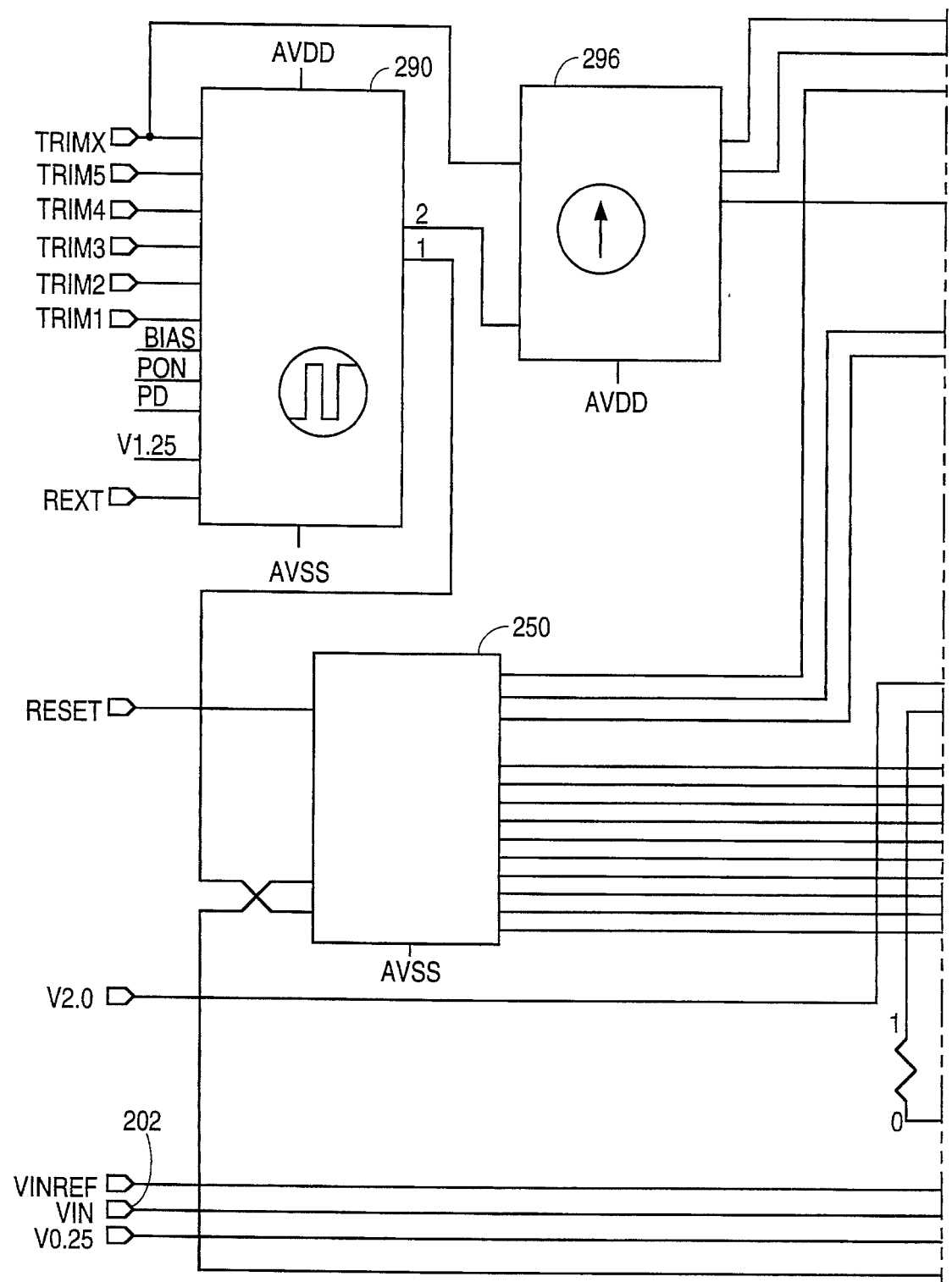
FIG. 2 illustrates a first circuit embodiment of a monolithic frequency converter forming a voltage-controlled or voltage-tuned oscillator.
Figure 2B:
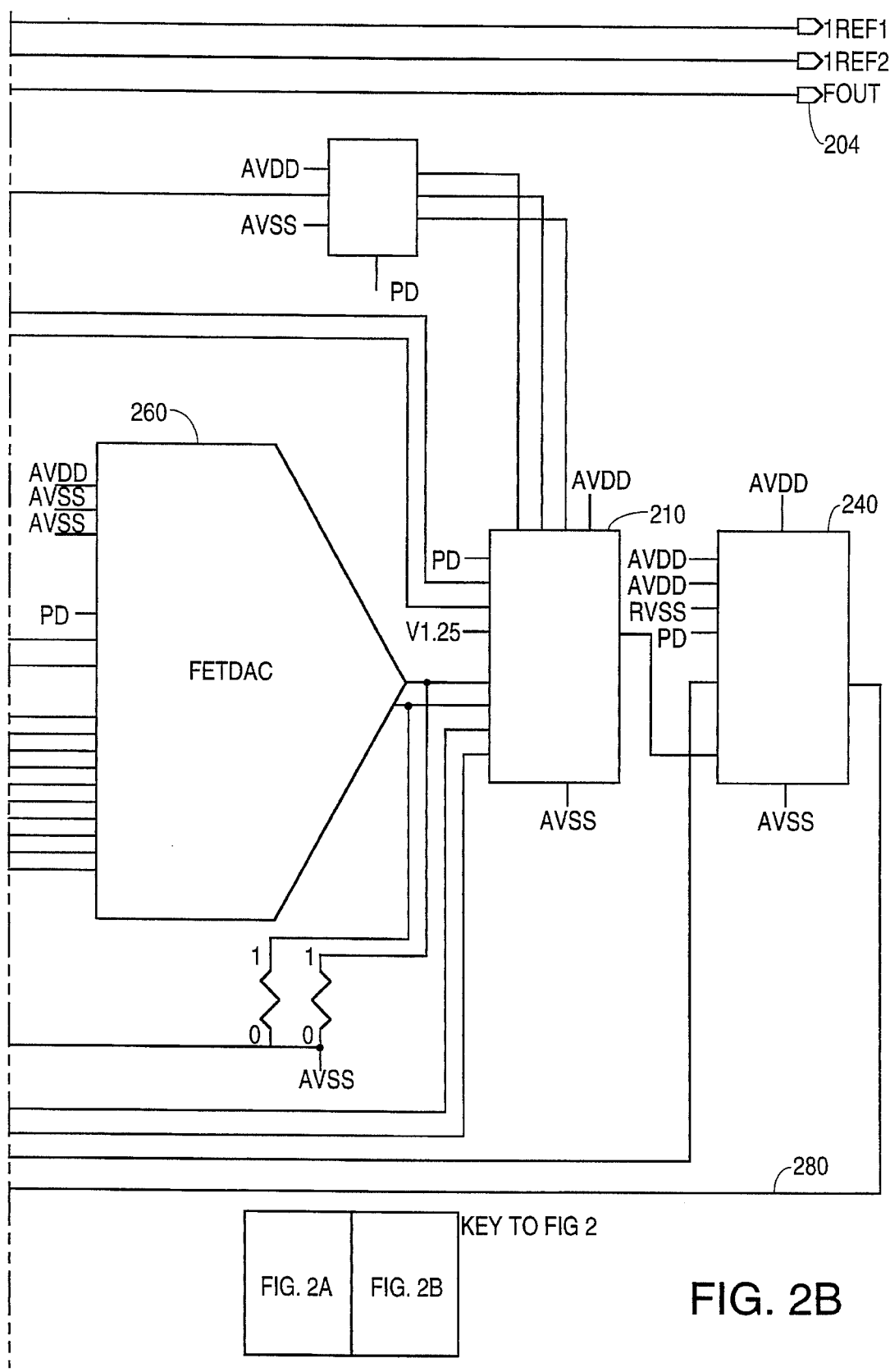

FIG. 2 illustrates a first circuit embodiment of a monolithic frequency converter 200, a circuit which operates as a voltage-controlled or voltage-tuned oscillator having an improved linearity of conversion. The voltage-controlled or voltage-tuned oscillator receives an input voltage signal VIN at an input terminal 202 and generates a frequency FOUT at an output terminal 204 which is a linear function of the input voltage signal. This first circuit embodiment achieves an extremely linear conversion of an input voltage to an output frequency.

The monolithic frequency converter 200 includes a VCO counter circuit 250, a FETDAC circuit 260, a difference integrator circuit 210 and a voltage-controlled oscillator VCO 240. The illustrative embodiment of the monolithic frequency converter 200 also includes an on-chip RC oscillator circuit 290 and a current reference circuit 296. The monolithic frequency converter 200 furnishes a feedback loop 280 to improve the performance of the VCO 240 alone and to overcome various performance limitations.

The VCO counter 250 is used to convert a frequency signal from the voltage-controlled oscillator (VCO) 240 to a digital signal indicative of frequency. VCO counter 250 counts the number of pulses from the VCO 240 for a specified time. The counting time is controlled by a timing signal from RC oscillator 290 which resets and then allows VCO counter 250 to count for a specified time and then stop. The count is transferred from VCO counter 250 to an input terminal of the FETDAC 260 at the end of the controlled counting period. FETDAC 260 is a 10-bit digital to analog converter which produces a DC voltage signal indicative of the frequency of the signal from the VCO 240. The DC voltage signal from the FETDAC 260 is applied to a first input terminal of the difference integrator circuit 210. An input voltage is applied to a second input terminal of the difference integrator circuit 210. In some embodiments of the frequency converter 200, the amplitude of the input voltage ranges from 0–2V. The difference integrator circuit 210 compares the DC voltage signal from the FETDAC 260 to the input voltage VIN and integrates the difference of the two signals over time. In this manner, the FETDAC 260 generates a voltage that is a function of the frequency.

The voltage from FETDAC 260 is compared to the input voltage signal VIN and the difference between the FETDAC voltage and input voltage signal VIN is integrated at specific intervals. If the input voltage signal VIN is different from the voltage on the FETDAC 260, the integrator of difference integrator circuit 210 integrates the difference, or error, between the voltage signals and applies the integrated difference signal to the VCO 240. As the error signal becomes larger, the integrated difference voltage applied to the VCO 240 becomes larger, causing the frequency of the signal generated by the VCO 240 to increase. As the frequency of the VCO 240 increases the VCO counter 250 counts a greater number of pulses. The FETDAC 260 responds to the increased count number by raising the voltage at the output of the FETDAC 260. The voltage is raised until the FETDAC 260 voltage and the input voltage match.

The RC oscillator circuit 290 is constructed on the integrated circuit chip. The RC oscillator circuit 290 includes multiple lines for controlling the oscillator to precisely trim the current to a desired accuracy. In the illustrative embodiment, the RC oscillator circuit 290 is an on-chip RC oscillator. In other embodiments, the RC oscillator may be replaced by a crystal oscillator controlled by a reference crystal or may be any suitable stable self-regulating oscillator that generates a continuous string of substantially periodic dock signals or pulses.

Figure 3:
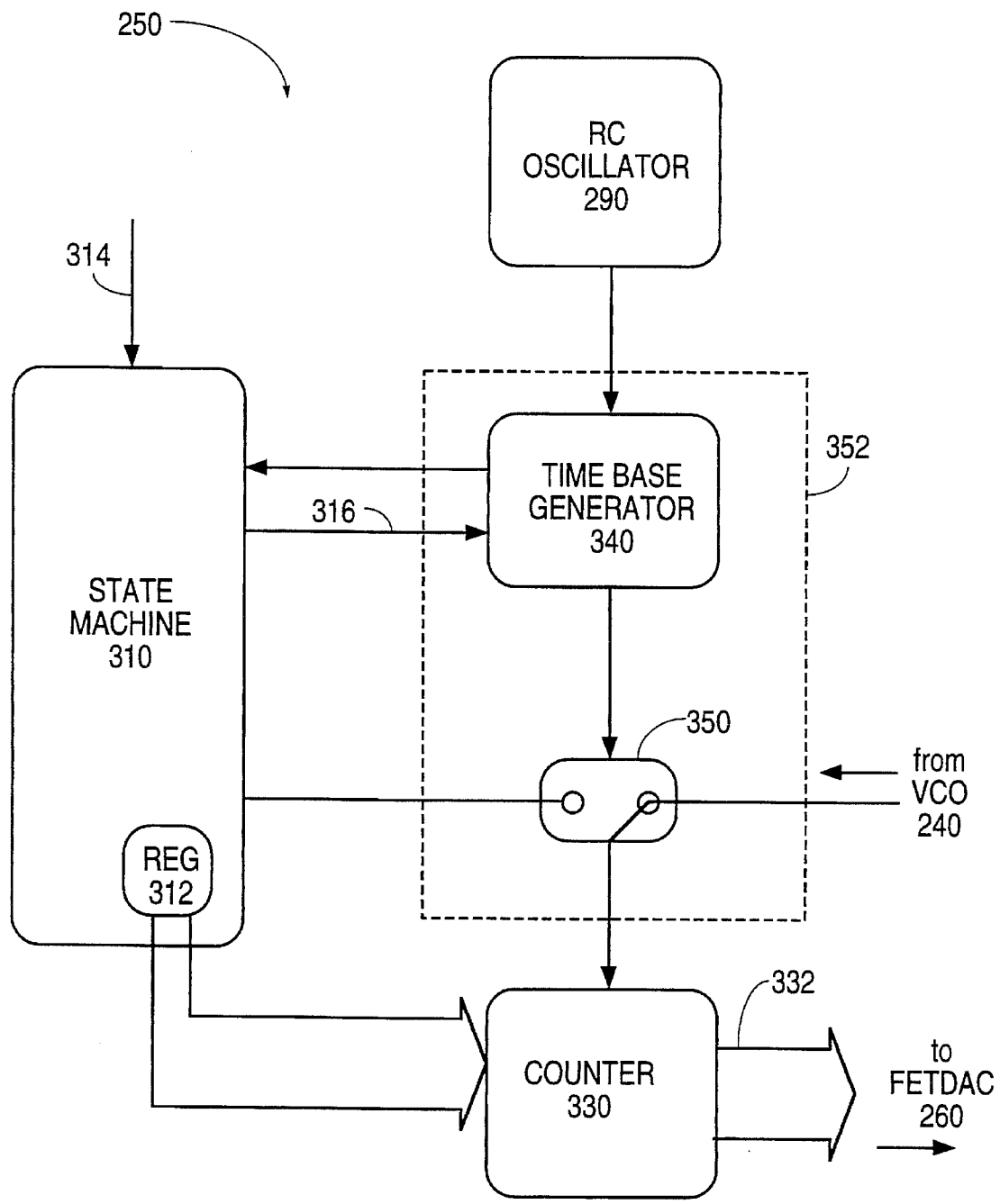
FIG. 3 depicts a schematic block diagram of a counter circuit utilized in the frequency converter shown in FIG. 2.

Referring to FIG. 3, there is shown a schematic block diagram of a VCO counter circuit 250 utilized in the frequency converter shown in FIG. 2. A suitable VCO counter circuit is described in further detail in U.S. Pat. No. 4,998,075 issued Mar. 5, 1991 (Charles R. Patton III and Timothy G. O'Shaughnessy), which is incorporated herein by reference in its entirety. The VCO counter 250 is a digital counter which counts and accumulates a count of pulses from the VCO 240. The VCO counter circuit 250 is controlled by signals from the RC oscillator circuit 290 and includes a state machine 310, a 10-bit counter 330, a time base generator 340, a switch 350. VCO counter 250 fundamentally performs two functions. First VCO counter 250 counts pulses from the VCO 240 utilizing the 10-bit counter 330. Second, the VCO counter 250 generates control signals on the basis of timing signals received from the RC oscillator. The control signals periodically reset the first 10-bit counter 330 block, determine what the VCO counter 250 is counting, and generates control signals to the difference integrator for periodically resetting the difference integrator.

The state machine 310 controls the generation of a frequency signal which tracks the frequency of counts that are produced by the voltage-controlled oscillator 240. The state machine 310 furnishes a timing reference signal on a reference signal line 316 to the time base generator 340 which defines a time interval during which VCO cycle pulses are counted. After the beginning of the time interval, the VCO counter 250 counts pulses. When the time interval expires, the VCO counter 250 resets the counter. The state machine 310 includes a memory in the form of a single 10-bit register 312. The 10-bit register 312 allows for frequency resolution of 0.1%.

The 10-bit counter 330 is connected by the switch 350 to the VCO 240 shown in FIG. 2. The switch 350 is controlled by a time base generator 340. In combination, the switch 350 and time base generator 340 form a time base gate 352 which controls the length of time for which pulses from the VCO 240 are applied to the 10-bit counter 330 and the length of time that pulses from the state machine 310 are applied to the 10-bit counter 330. The time base generator 340 is controlled by time reference pulses from the RC oscillator circuit 290. For example, signals from the RC oscillator define a timing base for controlling the VCO counter 250 to reset the 10-bit counter 330 and restart counting. The time period during which the time base generator 340 connects the RC oscillator timing signals to the 10-bit counter 330 is selected using control signals from the state machine 310. The state machine 310 is controlled and programmed using a one-bit power-on/reset line 314. The state machine 310 operates independently when power is activated by initially loading the register 312 from a ROM memory (not shown) or from an external source (not shown). Thus the controlled oscillator operates near a known frequency on power-up.

Frequency count data from the VCO 240 is loaded as the state machine 310 applies a signal which sets the time base generator 340 for a coarse tune time period and loads the 10-bit counter 330 with the coarse tune count derived from the register 312. The time base generator 340 is actively sequenced with clock pulses from the RC oscillator circuit 290. In response, the time base generator 340 closes the switch 350 to connect the controlled oscillator signal to the count input of the 10-bit counter 330. Simultaneously, the state machine 310 applies an up-count control signal causing the 10-bit counter 330 to count up one state for each clock signal from the oscillator 290. The time base generator 340 maintains the connection of the switch 350 until the coarse tune time period expires at which time the time base generator 340 causes the switch 350 to disconnect the VCO 240 input to the 10-bit counter 330 and to connect the state machine 310 connection to the 10-bit counter 330. The time base generator 340 also applies a signal to the state machine 310 which designates the end of the coarse tune period. At this time, the 10-bit counter 330 holds a count which is indicative of the frequency from the VCO 240.

The state machine 310 sets a sign bit (not shown) to control the 10-bit counter 330 to either count up or down then applies pulses to the 10-bit counter 330. The 10-bit counter 330 then counts in the indicated direction as each pulse is received. The pulses from the state machine 310 continue until the sign bit from the 10-bit counter 330 changes state, at which point the pulses from the state machine 310 and counting of the 10-bit counter 330 terminate. The values in the 10-bit counter 330 are then applied to the FETDAC 260 on ten bit-lines 332.

Referring again to FIG. 2, FETDAC circuit 260 is a digital to analog converter which is used to generate a feedback voltage. FETDAC 260 converts an arbitrary, discrete, multiple-bit digital signal into a continuously-variable, unitary analog signal. The feedback voltage has an analog value that is proportional to the frequency output of the VCO cell 240. The VCO counter 250 and the FETDAC circuit 260, in combination, function as a frequency to voltage converter. This function is the reverse function of the VCO cell 240. Digital signals indicative of frequency are connected from the VCO counter 250 to the FETDAC circuit 260. FETDAC 260 converts the digital signal from the VCO counter 250 into an analog voltage signal which is applied to the difference integrator circuit 210. FETDAC 260 generates two signals, a primary DAC output signal and an offset signal indicative of the offset of the primary DAC output signal, which are applied to the difference integrator. In some embodiments, the FETDAC 260 produces an offset voltage because, to operate appropriately, a current is always idled through the FETDAC. In such embodiments, the performance of FETDAC 260 is greatly impaired if the current is reduced to zero.

FETDAC circuit 260 has four input terminals, one output terminal and two power supply terminals. The input terminals include a 10-bit data input bus 50–59, a single overflow bit 510, a voltage reference VREF to set the LSB unit step and a power down input terminal PD. The output terminal is a DAC output terminal OUT which produces an output voltage signal that is a substantially monotonic function of a code on data input bus 50–59. The output voltage corresponds to the relationship, as follows:

$$VOUT=[\text{code } 50\text{--}59] \times VLSB,$$

or $$VOUT=SUM[D(n) \times 2^n]=VLSB,$$

where VLSB is a fraction of the voltage on terminal VREF. The power supply terminals include an analog positive supply terminal AVDD and an analog negative power supply terminal AVSS.

Figure 4:
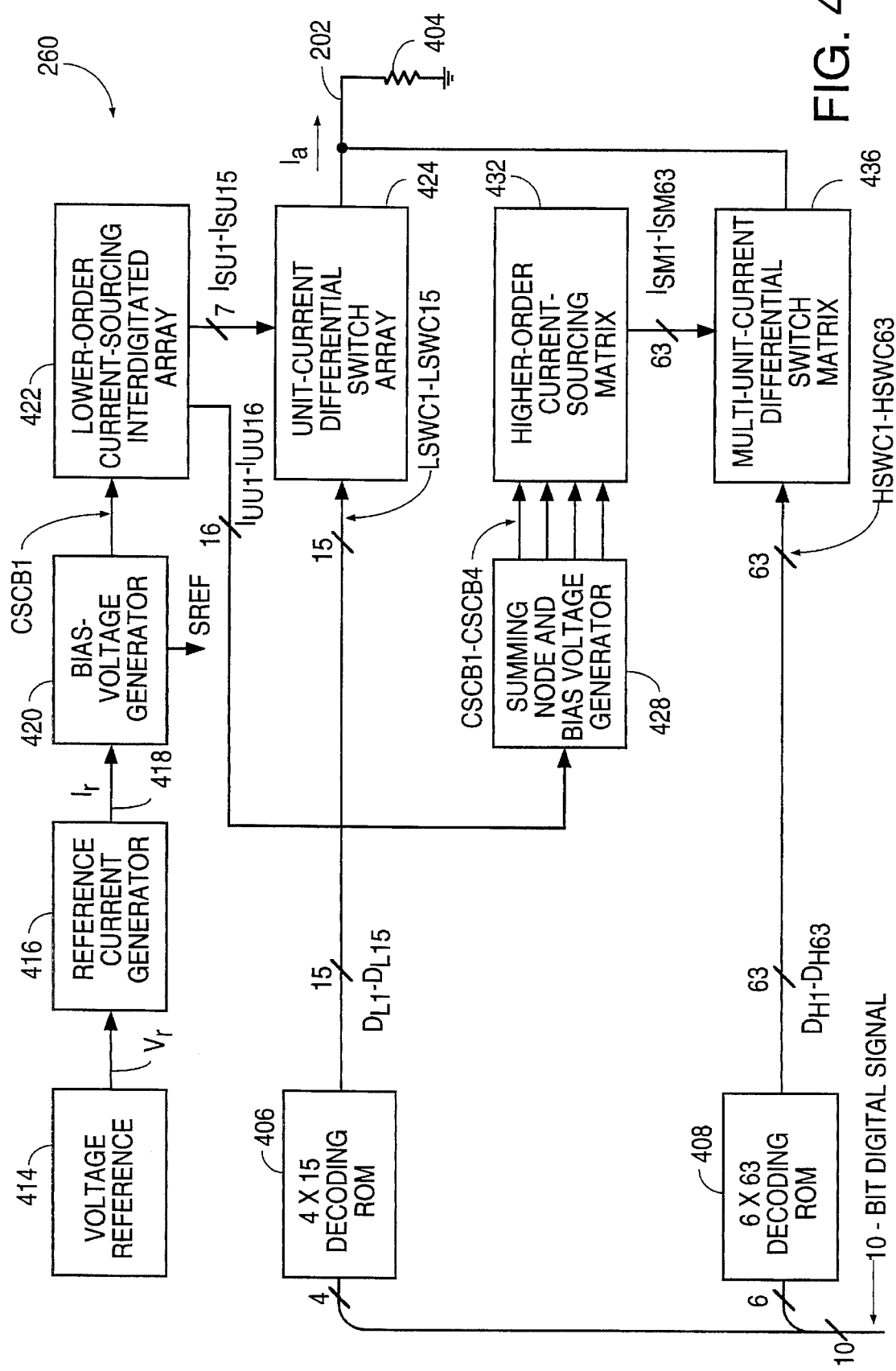
FIG. 4 depicts a schematic block diagram of a digital to analog converter circuit utilized in the frequency converter shown in FIG. 2.

Referring to FIG. 4, there is shown a schematic block diagram of a digital to analog converter circuit utilized in the frequency converter shown in FIG. 2. A suitable digital to analog converter circuit is described in further detail in U.S. Pat. No. 5,017,919 issued Apr. 21, 1991 (Richard W. Hull and Timothy G. O'Shaughnessy), which is incorporated herein by reference in its entirety. The FETDAC 260 has ten bits of resolution and has a linear accuracy of $\frac{1}{1024}$ (approximately 0.1%). FETDAC 260 includes a 6-bit DAC portion and a 4-bit DAC portion. The 6-bit DAC portion has 63 decoded matched current elements, each sixteen times the LSB current value. The 4-bit DAC portion has 15 decoded matched current elements, each equal to the LSB current value. Four LSB digital input bits D0, D1, D2 and D3 each select a corresponding binary weighted current from the 15 matched unit current sources. The output voltage is generated by summing the DAC currents to the output resistor.

Input signals to the FETDAC 260 include a reference voltage $V_r$ and a 10-bit digital signal having a 4-bit low order portion and a 6-bit high order portion. The output signal of the FETDAC 260 is an analog current Ia which flows in an output flow path 402 through a resistive load 404 to develop an output voltage proportional to the amplitude of the analog current Ia. The binary values of the digital input signal bits are defined by voltage levels referenced to a five volt power supply $V_{DD}$. Ideally, analog values defined by the analog signal generated by the FETDAC 260 have a one-to-one correspondence with the set of discrete values defined by the digital signal.

FETDAC 260 includes a reference current generator 416. In some embodiments, the reference current is produced externally and accessed using a pin on the integrated circuit. In other embodiments, the reference current is generated on the integrated circuit chip.

A flow path 418 carries an analog current $I_r$ having an amplitude which defines the analog signal. In some embodiments, the analog current is converted into an analog voltage by passing the current through a resistive load (not shown). The resistive load is external to the integrated circuit chip in some embodiments and internal to the chip in other embodiments.

A bias voltage generator 420 is connected to the reference current generator 416 and generates a first bias voltage CSCB1 having an amplitude dependent on the amplitude of the reference current. The bias voltage generator 420 is supplied by the analog current $I_r$ derived from the reference voltage V, which is generated external to the ASIC chip. The reference current $I_r$ flows in a flow path 418. The reference current $I_r$ is applied to the bias voltage generator to produce the first bias voltage CSCB1, which is referenced to the power supply terminal AVDD. The bias voltage generator 420 also produces a switch-reference voltage SREF. The first bias voltage CSCB1 is applied to a low-order current sourcing interdigitated array 422. The reference current generator 416 includes two pairs of diodeconnected FETs (not shown). Approximately one-quarter of the reference current $I_r$ flows through each of these diode-connected FETs. Each pair of diodeconnected FETs of the reference current generator 416 is positioned at an opposite end of a low-order current sourcing interdigitated array 422. In the interdigitated array 422, there are sixteen FETs (not shown) defining sixteen unswitched current sources (not shown). The first bias voltage CSCB1 biases the interdigitated array 422 and produces, in parallel, 31 separate unit currents, each of which mirrors the reference current $I_r$. The 31 separate currents include 15 switchable unit currents $I_{su1}$–$I_{su15}$ and 16 unswitched unit currents $I_{uu1}$–$I_{uu16}$.

A 4×15 decoding ROM 406 decodes the 4-bit low-order portion and produces 15 decoded control signals $D_{L1}$–$D_{L15}$. The 15 decoded control signals $D_{L1}$–$D_{L15}$ produce 15 low-order switch control signals LSWC1–LSWC15, which are applied to a first set of current sources (not shown) in a unit-current differential switch array 424. This first set of current sources is biased by the first bias voltage CSCB1 and produces, in parallel, a first plurality of switchable current sources that each mirror the reference current $I_r$. In the exemplary embodiment of the frequency converter 200, the first set of current sources includes fifteen switchable current sources. Each of the current sources is implemented by three FETs (not shown). One of the three FETs functions as a switchable current source and two as differential switches. Each switchable current source FET has a first W/L ratio, is biased by the first bias voltage CSCB1, and forms part of the low order current sourcing interdigitated array 422. Each of these fifteen FETs operates in its saturation region as a voltage-to-current converting circuit (not shown) and each converts the first bias voltage CSCB1 to a respective one of fifteen switchable currents that each mirror the reference current It. These fifteen mirrored current FETs are selectively switched to an output terminal of the FETDAC 260 as determined by the discrete value of the 4-bit low-order portion of the digital signal. The unit-current differential switch array 424 is controlled by low-order switch control signals LSWC1–LSWC15 and selectively switches the fifteen switchable unit currents to DAC output flow path 402 so that each selected current contributes a unit step to the analog current $I_r$. Each differential switch in differential switch array 424 is biased by the SREF voltage.

The sixteen unswitched current sources of the current-to-voltage converting circuit (not shown) are positioned alternately with the fifteen switchable current source FETs of the first set of current sources. Each of these sixteen FETs operates in its saturation region as a voltage-to-current converting circuit (not shown) and each converts the first bias voltage CSCB1 to a respective one of sixteen unswitchable currents that each mirror the reference current It. The sixteen unswitched currents are combined at a summing node 428 to form a summed current having an amplitude that is a multiple of the amplitude of the reference current $I_r$. The summing node 428 is defined by a diode-connected FET (not shown) which operates as a current-m-voltage converting circuit (not shown) that produces an intermediate bias voltage.

The unit-current differential switch array 424 is controlled by the digital value of a low-order portion of the digital signal and selectively switches the first plurality of switchable unit currents $I_{su1}$–$I_{su15}$ to the analog current flow path so that the analog signal is formed as a sum of a selected plurality of unit step current increments. The bias voltage generator 420 produces a second bias voltage having an amplitude controlled by a summed current produced in the FETDAC 260. The bias voltage generator 420 includes a summing circuit which is biased by the first bias voltage and produces a summed current having an amplitude that is a multiple of the amplitude of the reference current.

A 6X63 decoding ROM 408 decodes the 6-bit high-order portion and produces 63 decoded control signals $D_{H1}$–$D_{H63}$. The 63 decoded control signals $D_{H1}$–$D_{H63}$ produce 63 high-order switch control signals HSWC1–HSWC63, which are applied to a second set of current sources in a multiple-unit current differential switch matrix 436. This second set of current sources is biased by the second bias voltage and generates, in parallel, a second plurality of switchable currents that each mirror the summed current. In the exemplary embodiment of the frequency converter, the second set of current sources includes 63 switchable current sources forming a multiple unit current differential switch matrix 436. The multiple unit current differential switch matrix 436 is controlled by high-order switch control signals HSWC1–HSWC63 and selectively switches the 63 switchable multiple unit currents to FETDAC 260 output flow path so that each selected current contributes a multiple-step to the analog current. Each differential switch is biased by the SREF voltage. Each of the current sources is implemented by three FETs (not shown). One of the three FETs functions as a switchable current source and two as differential switches. Each switchable current source FET has a second W/L ratio and is biased by the second bias voltage. These 63 mirrored current FETs are selectively switched to an output terminal of the FETDAC 260 as determined by the discrete value of the 6-bit high-order portion of the digital signal. These 63 switchable current sources are organized into four separate arrays—three 16-element arrays and one 15-element array. Each of these 63 FETs operates in its saturation region as a voltage-to-current converting circuit (not shown) and each converts the second bias voltage to a respective one of fifteen switchable currents that each mirror the summed current.

A summing node and bias-voltage generator 428 includes four bias voltage generating circuits which are respectively connected to the four arrays of the second set of current sources. Each bias voltage generating circuit includes a voltage-to-current converting circuit (not shown) and a current-to-voltage converting circuit (not shown). The four bias voltage generating circuits each generate a bias voltage in response to the intermediate bias voltage produced by the first set of current sources. Each of the four bias voltages is referenced to the power supply $AV_{DD}$. The combined four arrays of high-order current sourcing matrix produce, in parallel, 63 switchable multi-unit currents $I_{sm1}$–$I_{sm63}$.

The multiple-unit current differential switch array 436 is controlled by the digital value of a high-order portion of the digital signal and selectively switches the second plurality of switchable unit currents $I_{sm1}$–$I_{sm63}$ to the analog current flow path so that the analog signal is augmented by a selected plurality of multiple-unit step current increments.

Referring again to FIG. 2, the difference integrator 210 compares the input voltage signal VIN to a voltage signal from the FETDAC 260. Difference integrator circuit 210 receives a voltage signal from FETDAC circuit 260 which is proportional to the output frequency of the controlled oscillator 240. Two signal lines carry the frequency signals. One signal line carries an offset signal. The second signal line carries a primary DAC voltage signal. The difference integrator circuit 210 also receives two signal lines from the VCO counter 250. These signal lines control the periodic resetting of the difference integrator. The difference integrator circuit 210 also receives the input voltage signal, which is directly connected to the difference integrator input terminal without passing through a load resistance. The voltage input signal of this embodiment of the frequency converter, drives only a capacitive load and not a resistive input load.

The difference integrator circuit 210 has six input terminals, one output terminal and two power supply terminals. The input terminals include a first noninverting input terminal POS1, a second non-inverting input terminal POS2, an inverting input terminal NEG, a control input terminal for initializing capacitors PRESET, a control terminal for activating sum and difference operations ENTER and a power down input terminal PD. The output terminal is an amplifier output terminal OUT which produces an output voltage signal that is a sum of voltages on the input terminal POS1 and the input terminal POS2, less the voltage on the input terminal NEG. The power supply terminals include an analog positive supply terminal AVDD and an analog negative power supply terminal AVSS. Difference integrator circuit 210 utilizes switched capacitors to realize the sum and difference operations by summing charge at a summing junction. The switched capacitor topology eliminates implementation of a TRACK and HOLD circuit applied to the voltage input signal VIN. The switched capacitor topology also furnishes a high input resistance at the analog inputs, in contrast to the low input resistance of a typical resistive difference amplifier. In addition, the switched capacitor technique furnishes sum and difference functions using only a single operational amplifier. The difference integrator 210 realizes the determination of a sampled VCO input signal VCOIN(N) in accordance with the equation:

$$VCOIN(N)=VIN(N)-VDAC(N)+VCOIN(N-1),$$

where VIN(N) is the input voltage signal and VDAC(N) is the signal from the FETDAC circuit 260. Integration is performed by adding the previous sampled VCO input signal VCOIN(N−1) to the current sample. Difference integrator circuit 210 performs this equation by applying the VIN signal to the input terminal POS1, the VDAC signal to the input terminal NEG and the VCOIN output signal on output terminal OUT from the previous sample to the input terminal POS2. If the FETDAC 260 voltage (VDAC) exceeds the input voltage VIN, an error voltage initiates corrective feedback to reduce the VCO 240 frequency.

Figure 5A:
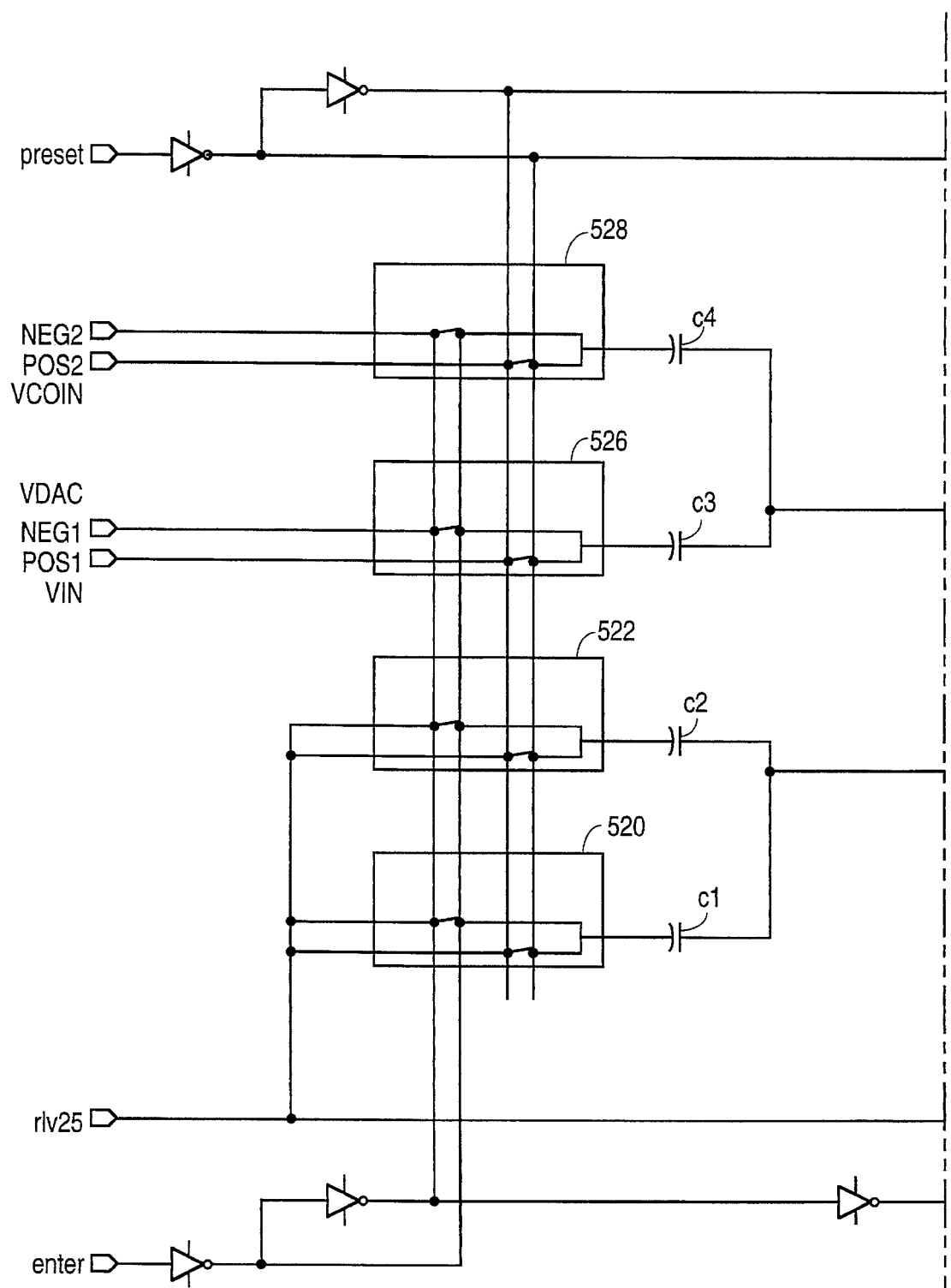
FIG. 5 illustrates a schematic circuit diagram of a difference integrator circuit in the frequency converter shown in FIG. 2.
Figure 5B:
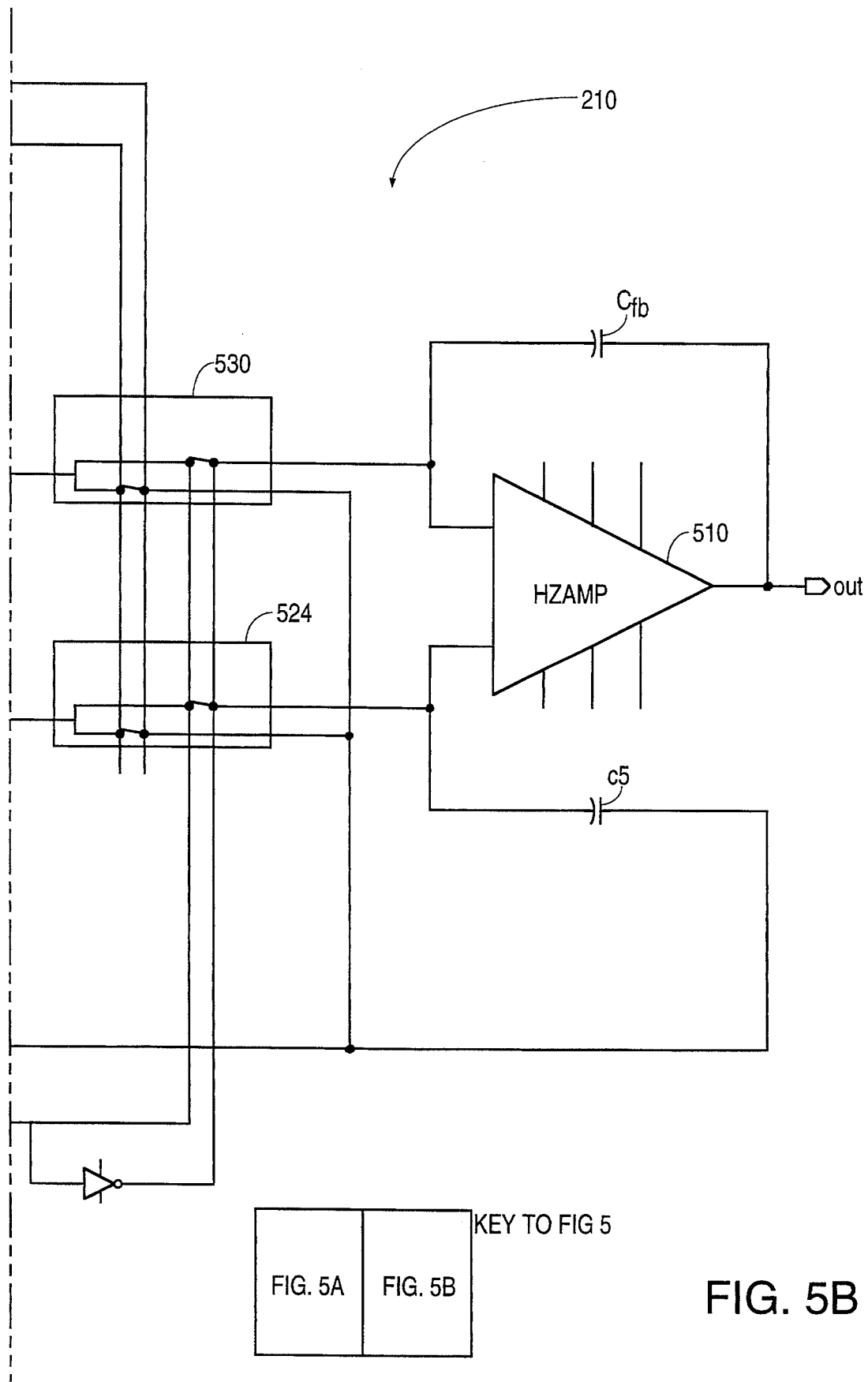

Referring to FIG. 5, a schematic circuit diagram shows a difference integrator circuit 210 of the frequency converter 200 shown in FIG. 2. The illustrative difference integrator 210 is a switched capacitor circuit, rather than a real-time integrator. The difference integrator 210 includes an operational. amplifier 510, capacitors Cfb, C1, C2, C3, C4 and C5, and six multiplexers 520, 522, 524, 526, 528 and 530. The noninverting terminal of the operational amplifier 510 receives the DAC offset signal, applied through a first switched capacitor network 512. The inverting terminal of the operational amplifier 510 receives a difference integrated signal, applied through a second switched capacitor network 514.

In the first switched capacitor network 512, the offset signal is applied to the two input terminals of each of the multiplexers 520 and 522. The output terminal of multiplexer 520 is connected to capacitor C1 and applied to multiplexer 524. The output terminal of multiplexer 522 is connected to capacitor C2 and applied to multiplexer 524. Capacitors C1 and C2, which are matched, are used to store the offset signal.

In the second switched capacitor network 514, the input signal VIN is applied to the POS1 input terminal and the DAC signal VDAC is applied to the NEG input terminal of multiplexer 526. The output terminal of multiplexer 526 is connected to capacitor C3 and applied to multiplexer 530. The VCO input signal VCOIN is applied to the POS2 input terminal of multiplexer 528. The output terminal of multiplexer 528 is connected to capacitor C4 and applied to multiplexer 530. Capacitors C3 and C4, which are matched, are utilized to store the value VIN(N)–VDAC(N)+VCOIN(N-1).

Switching of the first and second switched capacitor network 512 and 514 is controlled by the preset signal and the enter signal from VCO counter 250.

The inverting input terminal and the output terminal of operational amplifier 510 are connected through capacitor Cfb. The offset signal is connected to the noninverting input terminal of the operational amplifier 510 through capacitor C5. Capacitors Cfb and C5 are matched.

The switched capacitor difference integrator 210 offers advantages over a real-time integrator because a real-time integrator is continuously integrating. Thus, in a real-time integrator, the difference between the compared voltages is determined continuously. A switched capacitor difference integrator only compares the voltages periodically under the control of the VCO counter 250. Advantages arising due to usage of the switched capacitor difference integrator include an improved feedback stability performance and facilitation of cancellation of offset voltages.

Furthermore, feedback stability performance is enhanced because the output terminal of the difference integrator 210 is normally inactive, producing a static voltage that is normally held constant by a switched capacitive hold circuit. When the VCO counter 250 determines that it is time to update the information, VCO counter 250 requests update of the difference integrator 210. Intermittent sampling of the difference voltage is inherently more stable than constant difference updating. The difference integrator 210 acts as a discrete time integrator which is normally not integrating. The difference integrator 210 only integrates at the time that the signal is updated in accordance with a control signal from the VCO counter 250 called an "enter" signal. In this manner, the feedback loop operates in a DC-type mode, an inherently stable mode, until the VCO counter 250 sets the enter signal and activates the difference integrator 210.

Thus, two elements in the feedback loop prevent continuous feedback. One element is the VCO counter 250 which prevents updating of the FETDAC 260 while the counter is counting and applies a stable discrete digital signal to the FETDAC 260 when the counting is complete. The second element is the difference integrator which only updates the difference operation upon activation by the enter signal from VCO counter 250. Usage of the enter signal to activate the difference integrator delays updating of the difference signal until the DAC output signal is stable. By waiting until the DAC output signal is stable, the embodied feedback loop avoids noise signals due to "glitch energy" and switch transients. DAC circuits typically produce some glitch energy. Glitch energy is a noise signal generated by a DAC. As digital input signals to the DAC are changed, certain codes produce an output signal that overshoots very high or undershoots very low until the DAC has a chance to settle. These noise signals can have a large amplitude in the form of an impulse function. In circuits that do not incorporate a discrete time integrator in accordance with the described embodiments, glitch energy or settling time error from the DAC would be incorporated into the next evaluation loop. The integration function of a difference integrator does tend to smooth glitch energy. However, typically the glitch energy does not settle before significantly disturbing the input to the controlled oscillator, which then produces "jitter" and also disturbs the frequency of the controlled oscillator. Avoidance of DAC glitch energy and settling time transients makes a feedback loop inherently more stable and accurate. An additional advantage of the described frequency converter embodiments is that the discrete time integrator produces an output signal that approximates the final steady-state input to the controlled oscillator. This enables faster settling of the frequency converter.

Figure 6:
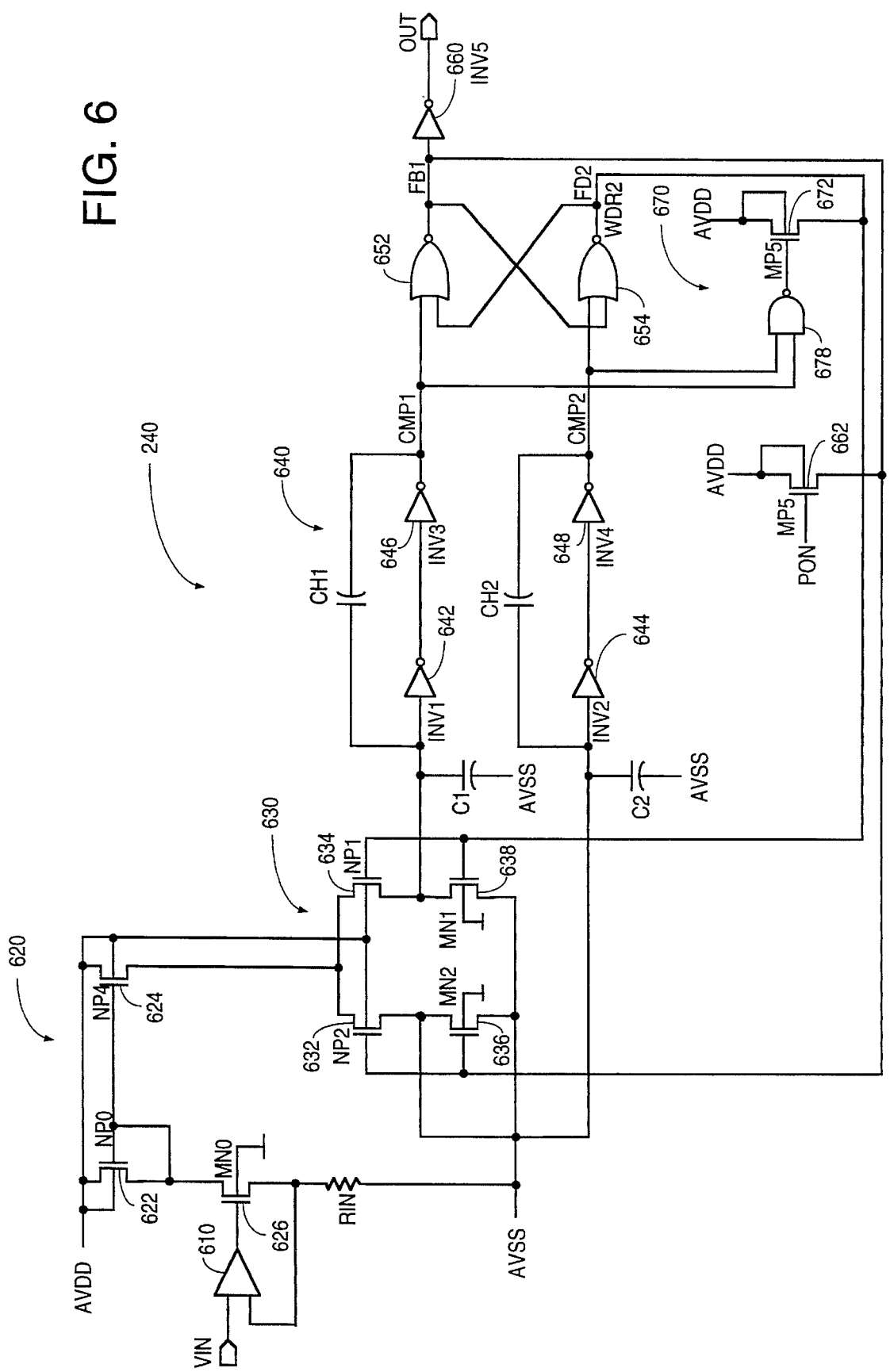
FIG. 6 illustrates a schematic circuit diagram of a voltage-controlled oscillator (VCO) in the frequency converter shown in FIG. 2.

Referring to FIG. 6, the VCO 240 includes an operational amplifier 610, a current mirror 620, a quadripole network 630, capacitors C1 and C2, inverter network 640, and NOR gates 652 and 654. The inverter network 640 includes inverters 642, 644, 646 and 648.

An input voltage VIN is applied to the noninverting input terminal of operational amplifier 610, which is configured in a negative feedback loop having the inverting input terminal of the operational amplifier 610 connected to a resistor RIN. As the voltage VIN is continuously applied, the operational amplifier 610 eventually reaches a steady state condition in which the signals applied to the noninverting and inverting input terminals of operational amplifier 610 are equal. In this steady state condition, the current through resistor RIN is substantially equal to the input voltage divided by the resistance of resistor RIN. This current is conducted through a MOS N-channel transistor (MN0) 626 to the current mirror 620. The current mirror 620 includes P-channel transistors (MP0) 622 and (MP4) 624.

Current from the current mirror 620 feeds the quadripole network 630 which includes P-channel transistors (MP1) 634 and (MP2) 632 and N-channel transistors (MN1) 638 and (MN2) 636. The quadripole network 630 controls the NOR gates 652 and 654 to have mutually complementary output states, one gate having a logic 1 value and the other having a logic 0 value, to determine the one transistor of N-channel transistors (MP1) 634 and (MP2) 632 that is conductive at one time. For example, when a logic 0 is applied to the gate of transistor (MP1) 634, the transistor is conductive so that current conducting through P-channel transistor (MP4) 624 charges capacitor C1. The logic 0 also appears at the gate of N-channel transistor (MN1) 638, making the transistor nonconductive. When a logic 0 is applied to the gates of transistors 634 and 638, a logic 1 is simultaneously applied to the gates of transistors 632 and 636 since the output signals of NOR gates 652 and 654 are mutually complementary. Therefore, capacitor C2 is discharged when capacitor C1 is charged. Capacitor C1 charges linearly towards the threshold voltage of inverter 642. When the switching threshold of inverter 642 is exceeded, the logic signal of inverter 646 goes high, charging capacitor CH1 and reinforcing the signal to inverter 642. Positive feedback through capacitor CH1 ensures that the output voltage of inverter 646 goes essentially to the rail of the positive power supply terminal AVDD. A suitable voltage transition of inverter 646, assures that the logic signal to NOR gate 652 has a range capable of crossing the threshold of NOR gate 652. As a logic 1 signal is applied to NOR gate 652, the output logic signal of the gate goes low.

As capacitor C1 is charged, capacitor C2 is being discharged. Thus, as the charge ramp is applied to the input terminal of inverter 642, the input terminal of inverter 644 is held at a logic 0 level and is not ramping. Therefore, the output logic state of inverter 648 is held at a logic 0 level. Once the output logic level of inverter 646 starts to go high due to the charging of capacitor C1, a logic 1 level is applied to the input terminal of NOR gate 652, causing the output terminal of the NOR gate 652 to transition to a logic 0 level. The output terminal of NOR gate 652 is connected to the input terminal of NOR gate 654 so that two logic 0 levels are applied to the input terminal of NOR gate 654, setting the output terminal of NOR gate 654 to a logic 1. This reinforces the original logic 1 level from the output terminal of inverter 646. The change of state in the output logic level of NOR gate 652 to a logic 0 and change of state in the output logic level of NOR gate 654 to a logic 1 is fed back to input terminals of the quadripole network 630 via feedback lines FB1 and FB2. Feedback line FB1 controls the gate of P-channel transistor (MP2) 632 with a logic 0 level so that transistor (MP2) 632 becomes conductive. Thus capacitor C2 is then charged with the linear ramp signal. As capacitor C2 is charged, the output condition of NOR gate 654 is a logic 1, which is applied to the gates of N-channel transistor (MN1) 638 and P-channel transistor (MP1) 634. Accordingly, P-channel transistor (MP1) 634 is turned off and N-channel transistor (MN1) 638 is turned on. The complementary action of N-channel transistor (MN1) 638 and P-channel transistor (MP1) 634 reinforces the signal to inverter INV1 642 and, when the threshold voltage of NOR gate 652 is crossed, the output logic state of NOR gate 652 changes to a logic 1 and is applied to an input terminal of NOR gate 654 to change the state of the NOR gate 654 to a logic 0. Thus capacitor C1 is discharged at the same time as capacitor C2 is charged.

The same process occurs with respect to capacitor C2. When the charge on capacitor C2 crosses the threshold of inverter 644, a logic 1 value is applied to the NOR gate 654 in a repeating oscillatory process. Thus the VCO 240 forms an astable multivibrator in which the current to feed the two capacitors C1 and C2 alternately ramps in a linear manner to the threshold voltage of inverters 642 and 644 respectively.

The period of oscillation of VCO 240 is the time for the current passing through transistor (MP4) 624 to charge the capacitors C1 and C2 to the threshold voltage of inverters 642 and 644 respectively. A very precise timing cycle having nearly a 50% duty cycle is achieved by matching of capacitors C1 and C2 since the same charging current is applied to both capacitors. The frequency of oscillation is set by selection of the resistance RIN and selection of the current mirror ratio of the current mirror 620.

The VCO 240 circuit also includes a fault detector 670 which includes NAND gate 678 and P-channel transistor (MP5) 672. In the absence of a fault detector, a fault might occur in case of a logic 1 condition of inverters 646 and 648 which causes application of logic 1 conditions to both input terminals of NOR gates 652 and 654. Thus NOR gates 652 and 654 simultaneously have a logic 0 condition so that both capacitors C1 and C2 charge to the threshold voltages of inverters 642 and 644. Oscillation of the VCO 240 would therefore stop.

Fault detector 670 prevents such a fault condition by detecting a simultaneous logic 1 input logic level to the NOR gates 652 and 654. The input signals to NOR gates 652 and 654 are applied to the input terminals of NAND gate 678 so that p-channel transistor 672 becomes conductive in case of simultaneous logic 1 levels. When N-channel transistor 672 becomes conductive, a line to the gates of P-channel transistor (MP1) 634 and N-channel transistor (MN1) 638 cause capacitor C1 to discharge to restore an oscillatory operating condition.

The voltage-controlled oscillator (VCO) 240 has three input terminals, one output terminal and two power supply terminals. The input terminals include a VCO voltage input terminal VIN, a reference voltage input terminal VREF and a power down input terminal PD. The output terminal is a VCO frequency output terminal VCOOUT which produces an output frequency signal having a range from approximately 4 kHz to 4 MHz. The power supply terminals include an analog positive supply terminal AVDD and an analog negative power supply terminal AVSS. VCO 240 produces an output frequency that is substantially monotonic relative to the input voltage at voltage input terminal VIN. VCO 240 produces an output frequency signal that drive the FIN input frequency to the VCO counter circuit 250. The FIN frequency signal is used to drive the eleven bit counter of the VCO counter 250. The FIN frequency is divided by four to produce a signal FOUT. The frequency is divided at the output to furnish a lower effective output frequency while the frequency of operation of the overall loop is significantly raised. Thus the controlled oscillator is forced to operate at a higher frequency. Operating the overall loop and the controlled oscillator at a higher frequency is advantageous to furnish a reduced settling time for an effective output frequency. The counter accumulates more timing pulses in a shorter time, which allows the frequency to be sampled more often. In effect, the feedback loop is operated at a higher frequency and the oscillator evaluates the loop status more often so that the settling time is accelerated. In many applications, settling time of a circuit is extremely important.

Figure 7A:
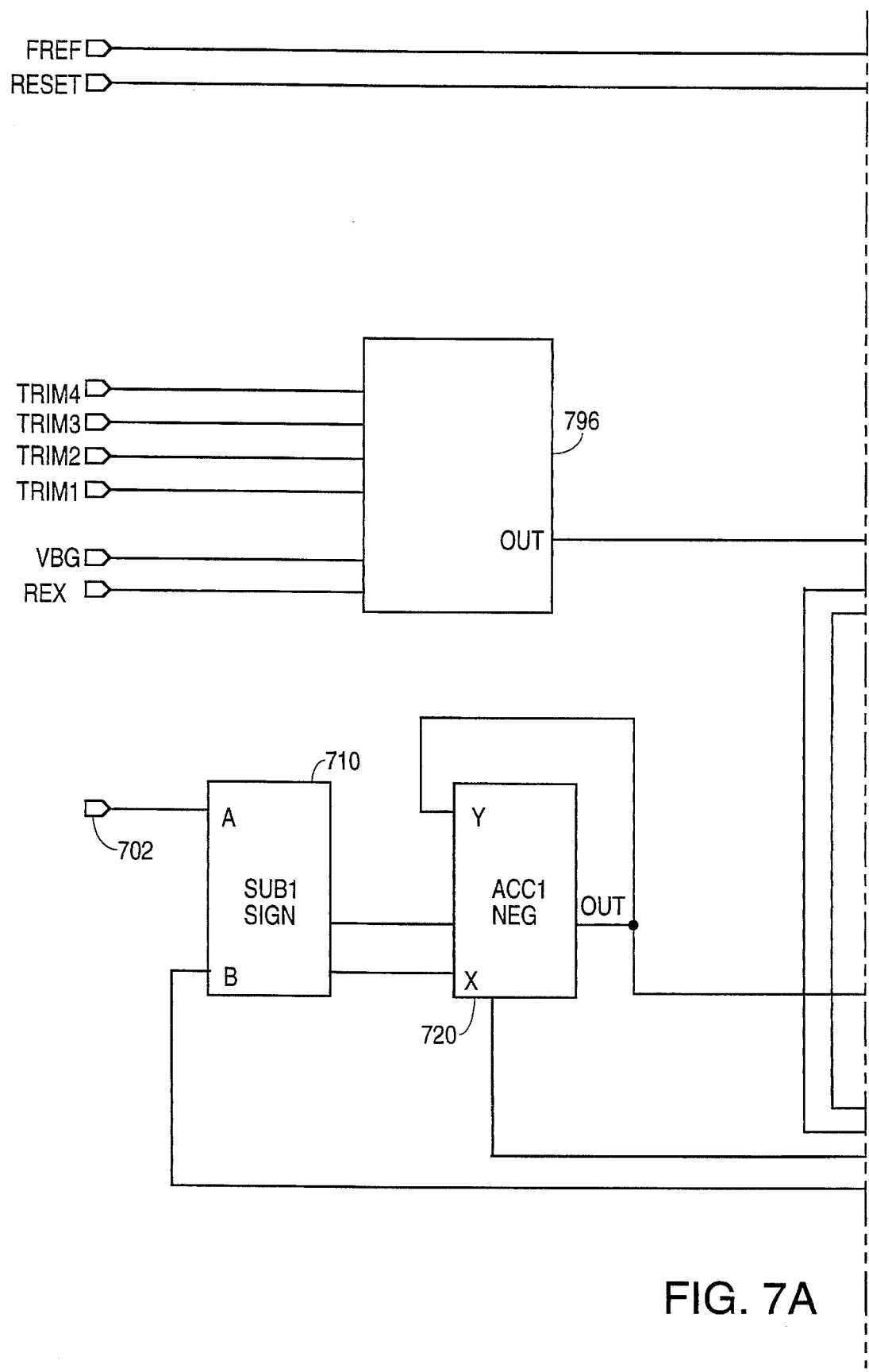
FIG. 7 illustrates a second specific embodiment of a monolithic frequency converter in the form of a digitally tuned oscillator.

FIG. 7 illustrates a second circuit embodiment of a monolithic frequency converter, a circuit which operates as a digitally tuned oscillator. The digitally-tuned oscillator receives a digitally-encoded input signal and generates a frequency which is a linear function of the digitally-encoded signal. This second circuit embodiment achieves an extremely linear conversion of a digital input code to an output frequency. The digital-tuned oscillator receives a 10-bit digitally-coded input signal FIN at an input terminal 702 and generates a frequency SHTOUT at an output terminal 704 which is a linear function of the input signal.

The monolithic digital-to-frequency converter 700 includes a counter circuit 750, a DAC circuit 730, a subtractor circuit 710, an accumulator circuit 720 and a current-controlled oscillator CCO 740. The illustrative embodiment of the monolithic digital-to-frequency converter 700 also includes a current reference circuit 796. The monolithic digital-to-frequency converter 700 furnishes a feedback loop 780 to improve the performance of the CCO 740 alone and to overcome various performance limitations.

The various circuit elements of the monolithic digital-to-frequency converter 700 are generally similar to the circuit elements of the monolithic frequency converter 200 shown in FIG. 2 and the generic frequency converter 100 illustrated in FIG. 1. For example, the counter circuit 750 is similar to the VCO counter circuit 250 and the frequency counter 150. The DAC circuit 730 is similar to the FETDAC circuit 260 and the feedback converter 160. The subtractor circuit 710 and accumulator circuit 720 combined are similar to the difference integrator circuit 210 and to the subtractor 110 and discrete time integrator 120.

However, the current-controlled oscillator CCO 740 is substantially different from the voltage-controlled oscillator VCO 240. The current-controlled oscillator 740 substantially improves the dynamic range of frequency conversion as compared to a typical conventional voltage-controlled oscillator (VCO). A conventional VCO typically has a guaranteed dynamic range of 2:1 in frequency over operating temperature, process and power supply voltage ranges. A conventional VCO utilizes a CMOS ring oscillator including an odd number of CMOS inverter stages. The dynamic range of a conventional VCO is limited predominantly by the CMOS ring oscillator. The CMOS ring oscillator tends to oscillate at a frequency equal to the loop delay. This occurs because, as the magnitude of the current that feeds a particular ring oscillator is reduced, the gate to source voltage of transistors in a CMOS inverter stage decreases so that the matching accuracy of each of the individual inverters gradually worsens. As the current is reduced below a particular critical value, the oscillator starts to misbehave. Either the delay between oscillator stages exhibits a mismatch or a greatly non-linear relationship between current and frequency evolves.

The current-controlled oscillator shown in various embodiments of the invention achieves a much wider dynamic range because the CCO does not use a voltage to form a current that causes the oscillator to generate a frequency. Instead the CCO directly converts current to a frequency.

Figure 8A:
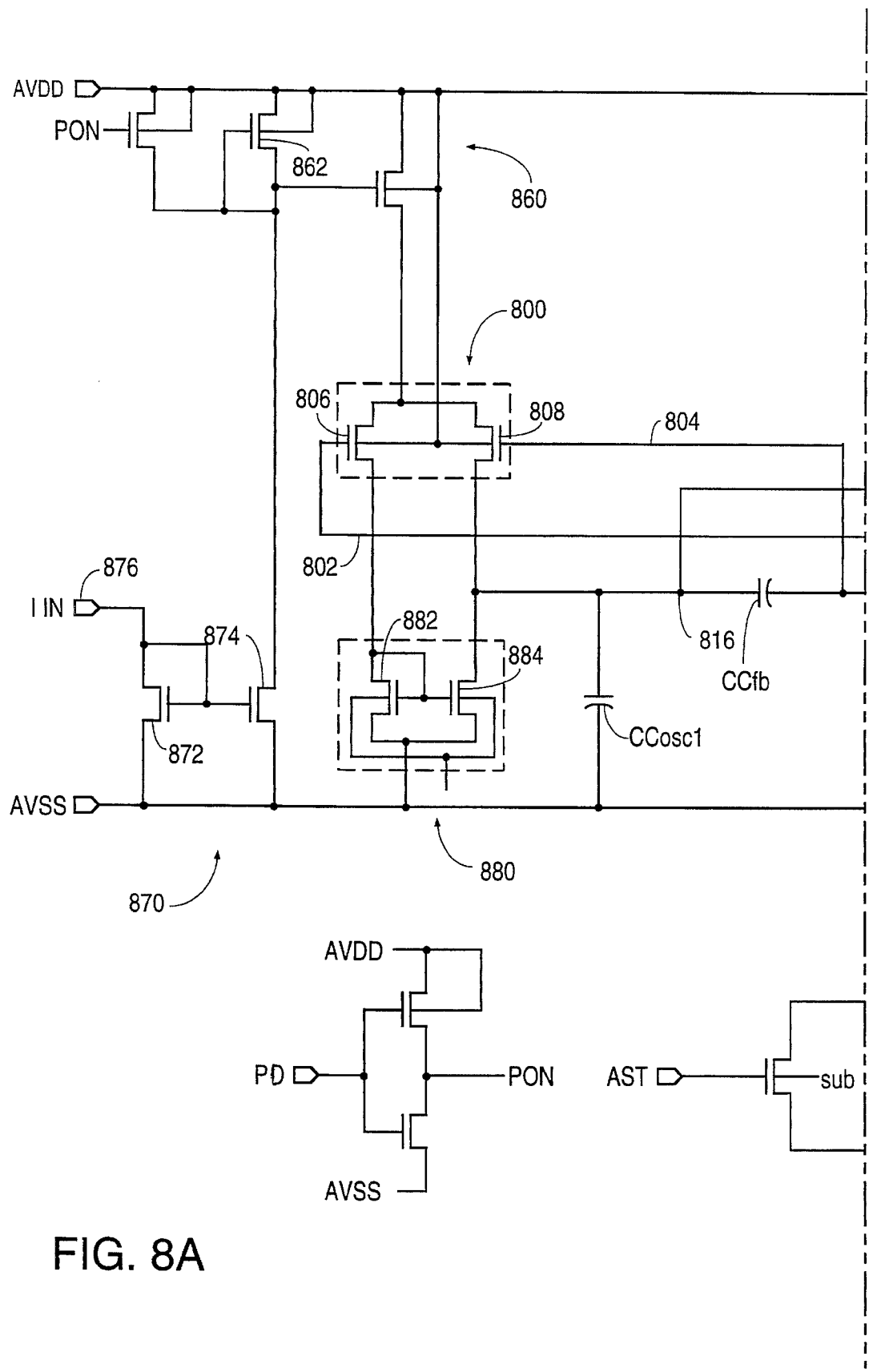
FIG. 8 depicts a schematic circuit diagram of a current-controlled oscillator (CCO) circuit in the frequency converter shown in FIG. 7.
Figure 8B:
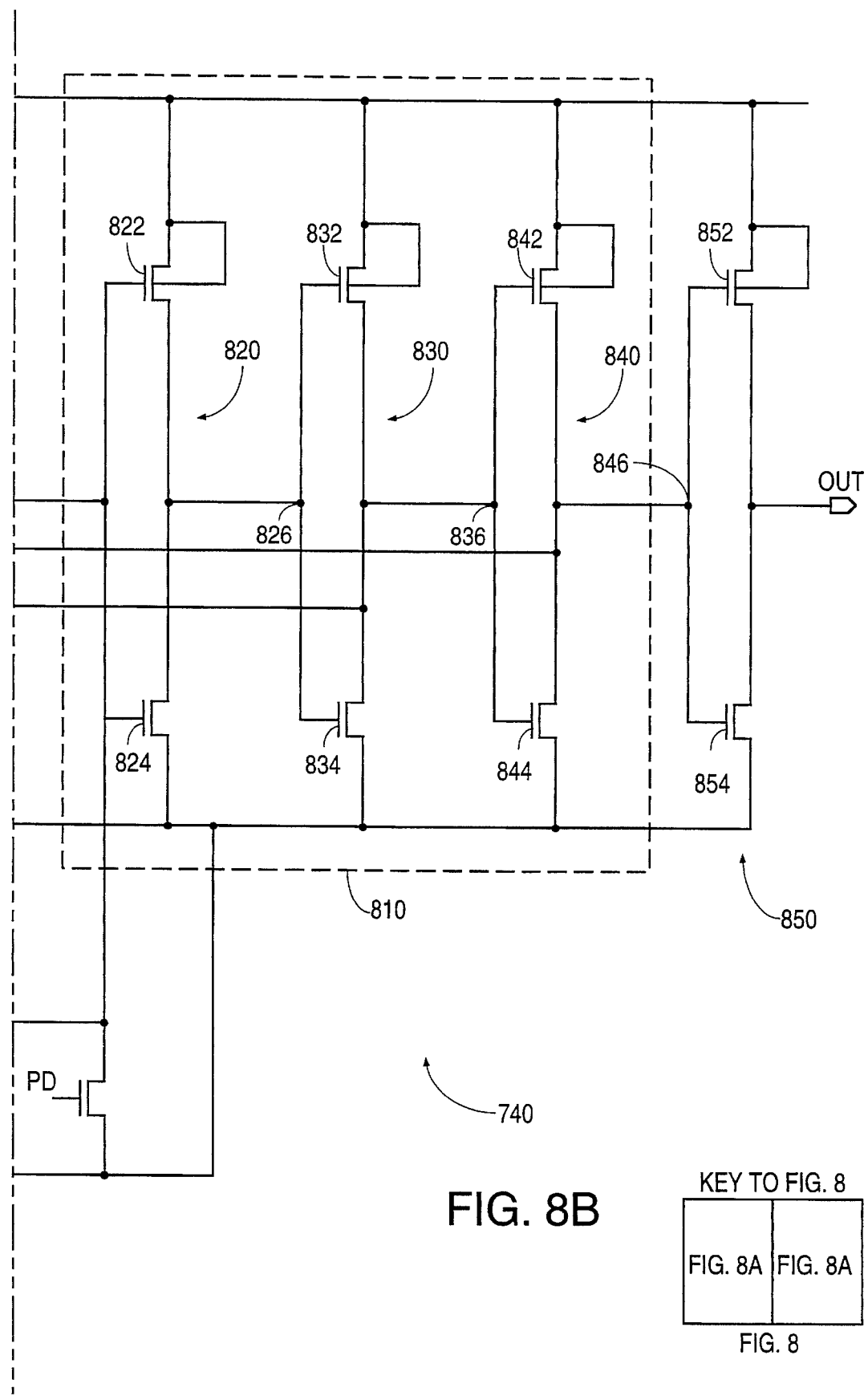

Referring to FIG. 8, there is shown a schematic circuit diagram of a current-controlled oscillator (CCO) circuit 740. CCO 740 includes a difference amplifier 800, ring oscillator 810, a buffer stage 850, a current source 860, a current mirror 870 and a current sink 880.

The ring oscillator 810 includes three CMOS inverter stages 820, 830 and 840. The first CMOS inverter stage 820 includes a P-channel transistor (MP3) 822 and an N-channel transistor (MN3) 824, each having a gate connected to an input node (1) 816. The second CMOS inverter stage 830 includes a P-channel transistor (MP5) 832 and an N-channel transistor (MNS) 834, each having a gate connected to an input node (3) 826 which is connected to the output signal of the first CMOS inverter stage 820 at drain terminals of P-channel transistor (MP3) 822 and an N-channel transistor (MN3) 824. The third CMOS inverter stage 840 includes a P-channel transistor (MP7) 842 and an N-channel transistor (MN7) 844, each having a gate connected to an input node (5) 836 which is connected to the output signal of the second CMOS inverter stage 830 at drain terminals of P-channel transistor (MP5) 832 and an N-channel transistor (MNS) 834. The output signal of the third CMOS inverter stage 840 at drain terminals of P-channel transistor (MP7) 842 and an N-channel transistor (MN7) 844 is connected back to a first input terminal 802 of the difference amplifier 800 and the output signal of the second CMOS inverter stage 830 at drain terminals of P-channel transistor (MP5) 832 and an N-channel transistor (MNS) 834 is connected back to a second input terminal 804 of the difference amplifier 800 so that the three CMOS inverter stages 820, 830 and 840 form a ring oscillator 810. An inversion occurs whenever a signal path traverses from a gate terminal to a drain terminal of a transistor. Thus an inversion occurs between each of the CMOS inverter stages 820, 830 and 840. For example, three stages of inversion intervene from the first CMOS invertor stage 820 to the second CMOS invertor stage 830 back to the difference amplifier 800.

The buffer stage 850 is formed by a P-channel transistor (MP9) 852 and an N-channel transistor (MN9) 854, each having a gate connected to an input node (7) 846. The buffer stage 850 isolates the CCO circuit 740 from other circuits in the frequency converter. Input node (7) to the buffer stage 850 is connected to the output signal of the third CMOS inverter stage 840 at drain terminals of P-channel transistor (MP7) 842 and an N-channel transistor (MN7) 844.

The difference amplifier 800 includes a first P-channel transistor 806 having a gate connected to the first input terminal 802 and a second P-channel transistor 808 having a gate connected to the second input terminal 804 forming a differential pair of transistors. The output signal generated by the difference amplifier 800 at the drain of the second P-channel transistor 808 is connected to an input node (1) 816 connected to the gates of the first CMOS inverter stage 820 P-channel transistor (MP3) 822 and N-channel transistor (MN3) 824. The output signal generated by the difference amplifier 800 at the drain of the second P-channel transistor 808 is also connected to a capacitor CCfb. Capacitor CCfb is also connected to the input node (5) 836.

No inversion takes place for a signal path traversing from a gate terminal to a source terminal of a transistor in a source follower, however the gain of such a signal path is very close to unity gain. Thus, the signal path from the source to the drain of P-channel transistor 808, forms a cascode amplifier having no inversion but having gain. Thus, traversing the signal path from the first P-channel transistor 806 and proceeding from the gate to the drain of the second P-channel transistor 808, there is no signal inversion. As the signal path passes to the first CMOS inverter stage 820, a first inversion occurs. The path flowing from the output terminal of the first CMOS inverter stage 820 to the input terminal of the second CMOS inverter stage 830 furnishes a second inversion. The path flowing from the output terminal of the second CMOS inverter stage 830 to the input terminal of the third CMOS inverter stage 840 furnishes a third inversion. The path flowing from the output terminal of the third CMOS inverter stage 840 to the input terminal at the gate of first P-channel transistor 806 of the differential pair. Thus, a ring oscillator 810 is formed having a difference amplifier 800 as an input structure and utilizing three CMOS inverters to furnish a ring oscillator function.

A ring oscillator does not typically supply an inherently linear relationship between an input pulsing function and an output frequency. However, the ring oscillator described herein furnishes such a signal relationship having an improved linearity.

The current source 860 supplying the difference amplifier 800 includes a first current source P-channel transistor (MP0) 862 and a second current source P-channel transistor (MP1) 864 which form a current mirror. Current source 860 is simply a current mirror formed by P-channel transistors (MP0) 862 and (MP 1 ) 864. A current mirror 870 includes a first current mirror N-channel transistor (MN0) 872 and a second current mirror N-channel transistor (MN1) 874. The second current mirror N-channel transistor (MN1) 874 forms the current mirror 870 with first current mirror N-channel transistor (MN0) 872 which is connected to access an input current at an input pin (IIN) 876.

Thus, the input current is applied at the input pin (IIN) 876 and passes through a current mirror 870 that ratios that current to first current source P-channel transistor (MP0) 862 which, in turn, ratios the current to second current source P-channel transistor (MP1) 864 and forms a current source 860 to the difference amplifier 800.

A linear transfer characteristic is typically achieved in a differential amplifier when the two input voltages of the differential amplifier are nearly equal and the field effect transistors of the differential amplifier are matched devices. In the embodiment described herein a perfectly matched difference amplifier 800 has a current split equally on the two drains of P-channel transistors 806 and 808 so that no change in voltage occurs at the drains of the two transistors 806 and 808. However, when the input signal on the gate of transistor 806 is high and the input signal on the gate of transistor 808 is low, the second P-channel transistor 808 is conductive and first P-channel transistor 806 is nonconductive causing the current from current source 860 to flow to input node (1) 816 and linearly charging the capacitor CCosc. The voltage on the capacitor CCosc changes linearly because the capacitor CCosc is charged with a fixed current. For a reversed polarity differential input voltage, when the input signal on the gate of transistor 806 is low and the input signal on the gate of transistor 808 is high, the first P-channel transistor 806 is conductive and second P-channel transistor 808 is nonconductive, causing current to flow to a diode-connected N-channel transistor (ND2) 882 of the current sink 880. This current is mirrored to an N-channel transistor 884 of the current sink 880 with an equal amount of current. In this condition, the current sink 880 removes charge from the capacitor CCosc, linearly decreasing the charge on capacitor CCosc because the current is fixed. In this manner, the current-controlled oscillator 740 forms a linear circuit which either charges or discharges the capacitor CCosc at a substantially fixed rate.

In operation, the state of the difference amplifier 800 is dependent upon the ring oscillator 810 output state formed by second CMOS inverter stage 830 and third CMOS inverter stage 840. The output signals of CMOS inverter stages 830 and 840 are mutually complementary after a short delay of approximately 1 to 3 nanoseconds so that, for example, if second CMOS inverter stage 830 has a high output then third CMOS inverter stage 840 will have a low output 1 to 3 nanoseconds later. Accordingly, a signal applied to the difference amplifier 800 becomes complementary after a delay so that second P-channel transistor 808 becomes high a delay period after first P-channel transistor 806 becomes low and vice versa. Thus, it also follows that capacitor CCosc is either charging or discharging depending upon the stage that exists at the output terminals of second CMOS inverter stage 830 and third CMOS inverter stage 840. Furthermore, second CMOS inverter stage 830 and third CMOS inverter stage 840 are always mutually complementary. In this manner, oscillation of the circuit is maintained. However, the difference amplifier 800 and the ring oscillator 810, without additional circuits, tend to oscillate almost instantaneously fast and at a very high frequency with nothing to slow the oscillation. This occurs because the ring oscillator 810 finds the threshold of the first CMOS inverter stage 820 and merely dithers around that threshold, not producing a sufficient signal amplitude but merely oscillating at a very high frequency.

Feedback capacitor CCfb is included to control the ring oscillator 810 at a particular selected frequency. Capacitor CCfb causes the ring oscillator 810 to have hysteresis. When the first CMOS inverter stage 820 changes state, the output of second CMOS inverter stage 830 changes state in the opposite direction. Thus, a positive feedback condition arises as the change in voltage of the output signal of second CMOS inverter stage 830 has the same polarity as the input signal to the gate of first CMOS inverter stage 820. The voltage on capacitor CCfb precharges the node (1) 816 at the junction between the capacitors CCfb and CCosc to a voltage which is basically the capacitance ratio of the capacitors. The combination of capacitors CCfb and CCosc form a capacitance voltage divider. The second CMOS inverter stage 830 switches rapidly, oscillating from rail to rail, changing the voltage at node (1) 816 at the junction of capacitors CCfb and CCosc and causing the fixed current source to alternately charge and discharge node (1) 816. The timing of oscillation is established by the time of charging and discharging node (1) 816 so that the voltage at the node crosses a threshold voltage level.

Accordingly, the current-controlled oscillator 740 operates in a highly linear manner with respect to current, even during high frequency operation. Furthermore, CCO 740 has a very wide dynamic range of input current to output frequency.

The digitally-tuned oscillator (DTO) and voltage-tuned oscillator (VTO) embodiments described in the foregoing are merely illustrative of numerous embodiments of various types of frequency converters and frequency synthesizers in accordance with the present invention. For example, a resistor-tuned oscillator (RTO) is realized using the VTO embodiment with a constant, known current source applied to the input terminal of the VTO to produce a voltage across a resistive element connected between the input terminal and ground. The resistance of the resistive element is thereby applied as an input signal to the oscillator. Similarly, a current-tuned oscillator is realized using the VTO embodiment with a current source applied to the input terminal of the VTO to produce a voltage across a known resistance connected between the input terminal and ground.

The description of certain embodiments of this invention is intended to be illustrative and not limiting. Numerous other embodiments will be apparent to those skilled in the art, all of which are included within the broad scope of this invention. Specific illustrative embodiments of a frequency converter in accordance with the invention include a voltage-controlled or voltage-tuned oscillator and a digitally-tuned oscillator. These embodiments are merely illustrative of many various types of frequency converters that are configured within the scope of the present invention, which is limited only by the claims which follow. In various embodiments, the input signal may be a voltage, a current, a resistance, a capacitance, or a digitally-encoded word. In other embodiments, a multiplexer may be connected to the input terminal so that various selected signals or all selected signals may be applied to the frequency converter.

What is claimed is:

1. A frequency converter comprising:
 a controlled oscillator having an input terminal and an output terminal and generating variable frequency signal pulses at the output terminal at a frequency controlled by an electrical signal applied at the input terminal;
 a frequency counter coupled to the output terminal of the controlled oscillator and including a tinning signal generator and a pulse counter, the pulse counter counting signal pulses and generating a digital code indicative of frequency therefrom;

a digital to analog converter coupled between the frequency counter and the controlled oscillator and converting the digital code indicative of frequency to an analog electrical signal; and a difference integrator coupled between the frequency counter and the controlled oscillator, coupled to an input signal terminal and coupled to the timing signal generator, the difference integrator determining a difference signal between an input signal and a signal operated upon by the digital to analog converter and integrating the difference signal under control of a timing signal generated by the timing signal generator.

2. A frequency converter according to claim 1, wherein:

the frequency converter is a voltage-tuned oscillator;

the controlled oscillator is a voltage-controlled oscillator (VCO) having an input terminal coupled to the difference integrator and an output terminal coupled to the frequency counter;

the frequency counter has an input terminal coupled to the output terminal of the voltage-controlled oscillator, a plurality of output lines coupled to the digital to analog converter for communicating the digital code indicative of frequency and an output control line coupled to the difference integrator;

the digital to analog converter has a plurality of input lines coupled to the output lines of the frequency counter and an analog output line coupled to the difference integrator; and the difference integrator has an input terminal coupled to the analog output line of the digital to analog converter and an input control line coupled to the output control line of the frequency counter.

3. A frequency converter according to claim 2, wherein the difference integrator includes a plurality of switched capacitors to realize sum and difference operations by summing charge at a summing junction.

4. A frequency converter according to claim 3, wherein the difference integrator determines a sampled VCO input signal VCOIN(N) in accordance with the equation:

$$VCOIN(N)=VIN(N)-VDAC(N)+VCOIN(N-1),$$

where VIN(N) is an input voltage signal and VDAC(N) is a signal from the digital to analog converter.

5. A frequency converter according to claim 3, wherein the switched capacitor difference integrator only compares the voltages periodically under the control of timing signals from the frequency counter.

6. A frequency converter according to claim 1, wherein:

the frequency converter is a digitally-tuned oscillator;

the controlled oscillator is a current-controlled oscillator (CCO) having an input terminal coupled to the digital to analog converter and an output terminal coupled to the frequency counter;

the frequency counter has an input terminal coupled to the output terminal of the current-controlled oscillator, a plurality of output lines coupled to the difference integrator for communicating the digital code indicative of frequency and an output control line coupled to the difference integrator;

the difference integrator has a plurality of input lines coupled to the output lines of the frequency counter, a plurality of signal input lines at the input signal terminal for receiving a digital input signal and a plurality of output lines coupled to the digital to analog converter for communicating a digital difference integral signal; and the digital to analog converter has a plurality of input lines coupled to the output lines of the difference integrator and an analog output line coupled to the current-controlled oscillator.

7. A frequency converter according to claim 6, wherein the difference integrator includes:

a subtractor having a plurality of input lines coupled to the output lines of the frequency counter, a plurality of signal input lines at the input signal terminal for receiving a digital input signal and a plurality of output lines; and an accumulator having a plurality of input lines coupled to the output lines of the subtractor, a control input line coupled to the frequency counter and a plurality of output lines coupled to the digital to analog converter for communicating the digital difference integral signal.

8. A frequency converter according to claim 7, wherein the accumulator integrates a digital difference signal received from the subtractor under control of a timing signal generated by the timing signal generator.

9. A frequency converter according to claim 6 wherein the current-controlled oscillator (CCO) comprises:

a difference amplifier;

an oscillator capacitor coupled to the difference amplifier;

a ring oscillator coupled to the difference amplifier by a feedforward path and a feedback path; and a feedback capacitor coupled between the difference amplifier and the ring oscillator in the feedback path.

10. A frequency converter according to claim 9 wherein the current-controlled oscillator (CCO) further comprises:

a buffer stage coupled to the ring oscillator.

11. A frequency converter according to claim 9 wherein the current-controlled oscillator (CCO) further comprises:

a current source coupled to the difference amplifier;

a current sink coupled to the difference amplifier; and a current mirror coupled to the current source.

12. A frequency converter according to claim 9 wherein the ring oscillator includes:

a first CMOS inverter stage having an input terminal coupled to the difference amplifier and having an output terminal;

a second CMOS inverter stage having an input terminal coupled to the output terminal of the first CMOS inverter stage and having an output terminal coupled to a first control terminal of the difference amplifier; and a third CMOS inverter stage having an input terminal coupled to the output terminal of the second CMOS inverter stage and having an output terminal coupled to a second control terminal of the difference amplifier.

13. A frequency converter according to claim 12 wherein the difference amplifier includes:

a first P-channel transistor having a gate coupled to the first control terminal, a source coupled to a current source and a drain coupled to a current sink and to the input terminal of the first CMOS inverter stage; and a second P-channel transistor having a gate coupled to the second input terminal, a source coupled to the current source and a drain coupled to the current sink.

14. A frequency converter according to claim 12 wherein a CMOS inverter stage of the first, second and third CMOS inverter stages comprises:

a P-channel transistor having a gate coupled to the CMOS inverter stage input terminal, a source coupled to a VDD power source, a drain coupled to the CMOS inverter stage output terminal and a backgate coupled to the VDD power source; and an N-channel transistor having a gate coupled to the CMOS inverter stage input terminal, a source coupled to a VSS power source and a drain coupled to the CMOS inverter stage output terminal.

15. A frequency converter according to claim 1, wherein all circuit components are formed on a single integrated circuit chip in a monolithic circuit.

16. A method of generating a source of synthesized frequency from a timing source comprising the steps of:

generating timing pulses at a frequency controlled by an electrical signal;

counting a number of generated timing pulses during a fixed interval;

deriving a timing signal based on the timing pulse count;

determining a difference signal, the difference signal being the difference between the timing pulse count and an input signal;

integrating the difference signal at a time controlled by the timing signal to determine the electrical signal for controlling the frequency of generating timing pulses.

17. A method according to claim 16 further comprising the step of converting the timing pulse count into a feedback signal having a form comparable to the input signal.

18. A method according to claim 16 further comprising the step of converting the integrated difference signal into an electrical signal for controlling the frequency of generation of timing pulses.

19. A method according to claim 16 wherein the timing pulses are generated at a frequency controlled by a voltage signal.

20. A method according to claim 16 wherein the timing pulses are generated at a frequency controlled by a current signal.

21. A method according to claim 16 wherein the input signal is a signal selected from the group of signals including voltage, current, resistance, capacitance, impedance and a digital code signals.

22. A current-controlled oscillator (CCO) comprising:

a difference amplifier;

an oscillator capacitor coupled to the difference amplifier;

a ring oscillator coupled to the difference amplifier by a feedforward path and a feedback path; and a feedback capacitor coupled between the difference amplifier and the ring oscillator in the feedback path.

23. A CCO according to claim 22, further comprising a buffer stage coupled to the ring oscillator.

24. A CCO according to claim 22, further comprising:

a current source coupled to the difference amplifier;

a current sink coupled to the difference amplifier; and a current mirror coupled to the current source.

25. A CCO according to claim 22 wherein the ring oscillator includes:

a first CMOS inverter stage having an input terminal coupled to the difference amplifier and having an output terminal;

a second CMOS inverter stage having an input terminal coupled to the output terminal of the first CMOS inverter stage and having an output terminal coupled to a first control terminal of the difference amplifier; and a third CMOS inverter stage having an input terminal coupled to the output terminal of the second CMOS inverter stage and having an output terminal coupled to a second control terminal of the difference amplifier.

26. A CCO according to claim 25 wherein the difference amplifier includes:

a first P-channel transistor having a gate coupled to the first control terminal, a source coupled to a current source and a drain coupled to a current sink and to the input terminal of the first CMOS inverter stage; and a second P-channel transistor having a gate coupled to the second input terminal, a source coupled to the current source and a drain coupled to the current sink.

27. A CCO according to claim 25 wherein a CMOS inverter stage of the first, second and third CMOS inverter stages comprises:

a P-channel transistor having a gate coupled to the CMOS inverter stage input terminal, a source coupled to a VDD power source, a drain coupled to the CMOS inverter stage output terminal and a backgate coupled to the VDD power source; and an N-channel transistor having a gate coupled to the CMOS inverter stage input terminal, a source coupled to a VSS power source and a drain coupled to the CMOS inverter stage output terminal.

* * * * *

UNITED STATES PATENT AND TRADEMARK OFFICE
CERTIFICATE OF CORRECTION

PATENT NO.   : 5,521,556
DATED        : May 28, 1996
INVENTOR(S)  : O'Shaughnessy et al.

It is certified that error appears in the above-identified patent and that said Letters Patent is hereby corrected as shown below:

Col. 11, line 8,   delete "It" and insert --$I_r$--.

Signed and Sealed this

Second Day of December, 1997

Attest:

BRUCE LEHMAN

Attesting Officer

Commissioner of Patents and Trademarks